United States Patent
Xu et al.

(10) Patent No.: US 10,738,218 B2
(45) Date of Patent: Aug. 11, 2020

(54) POLYSILOXANE, MATERIAL FOR SEMICONDUCTOR, AND PREPARATION METHOD FOR SEMICONDUCTOR AND SOLAR CELL

(71) Applicant: TORAY INDUSTRIES, INC., Tokyo (JP)

(72) Inventors: Fangrong Xu, Shanghai (CN); Ping Li, Shanghai (CN); Takeshi Ikeda, Shanghai (CN); Wei Song, Shanghai (CN); Guangnan Jin, Shanghai (CN); Masaaki Umehara, Otsu (JP); Tsuyoshi Kitada, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/314,493

(22) PCT Filed: Aug. 23, 2017

(86) PCT No.: PCT/CN2017/098627
§ 371 (c)(1),
(2) Date: Dec. 31, 2018

(87) PCT Pub. No.: WO2018/040990
PCT Pub. Date: Mar. 8, 2018

(65) Prior Publication Data
US 2019/0203071 A1    Jul. 4, 2019

(30) Foreign Application Priority Data

Aug. 31, 2016   (CN) .......................... 2016 1 0787280
Aug. 31, 2016   (CN) .......................... 2016 1 0787302

(51) Int. Cl.
*H01L 21/225*    (2006.01)
*C09D 183/06*    (2006.01)
(Continued)

(52) U.S. Cl.
CPC .......... *C09D 183/06* (2013.01); *C08G 77/14* (2013.01); *C08G 77/16* (2013.01); *C09D 5/24* (2013.01);
(Continued)

(58) Field of Classification Search
None
See application file for complete search history.

(56) References Cited

U.S. PATENT DOCUMENTS 5,998,509 A    12/1999   Hayase et al.
9,691,935 B2    6/2017   Inaba et al.
(Continued)

FOREIGN PATENT DOCUMENTS

CN    102803439 A    11/2012
CN    104538501 A     4/2015
(Continued)

OTHER PUBLICATIONS

International Search Report, issued in PCT/CN2017/098627, PCT/ISA/210, dated Nov. 20, 2017.
(Continued)

*Primary Examiner* — Asok K Sarkar
(74) *Attorney, Agent, or Firm* — Birch, Stewart, Kolasch & Birch, LLP

(57) ABSTRACT

Provided is a polysiloxane, containing at least one segment selected from molecular structures shown by formula 1 below, (1)

(Continued)

Diffusion wherein in formula 1, Q is an alkyl containing an alcoholic hydroxyl and having less than 12 carbon atoms in the main chain, or an alkyl containing an alcoholic hydroxyl and having less than 12 non-hydrogen atoms in the main chain and containing a heteroatom; and T is a hydroxyl, an alkyl, an alkyl containing an alcoholic hydroxyl and having less than 12 carbon atoms in the main chain, or an alkyl containing an alcoholic hydroxyl and having less than 12 non-hydrogen atoms in the main chain and containing a heteroatom. A doped slurry and a mask material prepared by using the polysiloxane, on the basis of having a good diffusivity, also have a good barrier property and a small amount of diffusion in air. In addition, according to a manufacturing method for a semiconductor, the diffusion in air of a doped impurity in the doped slurry is further reduced, so that the quality of a doping process can be further improved.

32 Claims, 6 Drawing Sheets

(51) Int. Cl.

| | | |
|---|---|---|
| *C08G 77/16* | (2006.01) | |
| *H01L 21/02* | (2006.01) | |
| *C09D 7/20* | (2018.01) | |
| *C08G 77/14* | (2006.01) | |
| *C09D 5/24* | (2006.01) | |
| *H01L 21/324* | (2006.01) | |
| *H01L 31/18* | (2006.01) | |
| *C08G 77/00* | (2006.01) | |

(52) U.S. Cl.
CPC ............. *C09D 7/20* (2018.01); *H01L 21/02* (2013.01); *H01L 21/02236* (2013.01); *H01L 21/2255* (2013.01); *H01L 21/324* (2013.01); *H01L 31/1804* (2013.01); *H01L 31/1864* (2013.01); *C08G 77/70* (2013.01); *C08G 77/80* (2013.01)

(56) References Cited

U.S. PATENT DOCUMENTS

2011/0316054 A1* 12/2011 Fedder ............... G01N 27/4148
257/253
2012/0077307 A1 3/2012 Kim et al.

FOREIGN PATENT DOCUMENTS

| CN | 105378895 A | 3/2016 |
|---|---|---|
| JP | 2006-9000 A | 1/2006 |

OTHER PUBLICATIONS

Written Opinion of the International Searching Authority, issued in PCT/CN2017/098627, PCT/ISA/237, dated Nov. 20, 2017.

\* cited by examiner

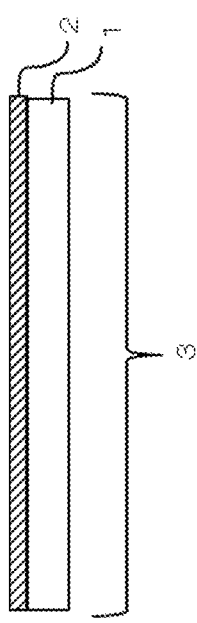
Figure 3i
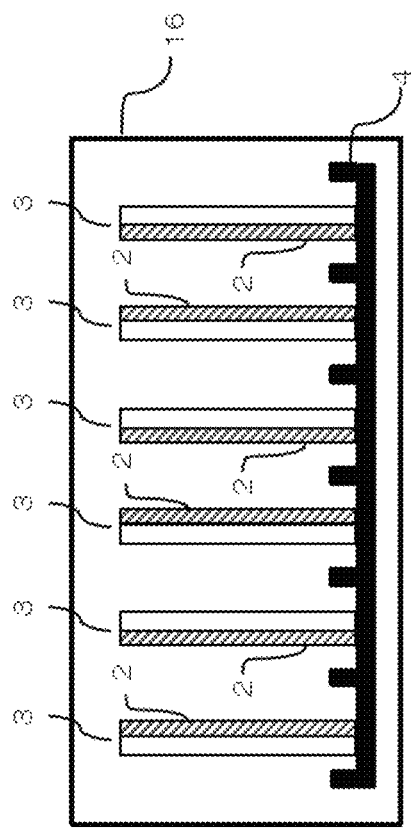
Figure 3ii
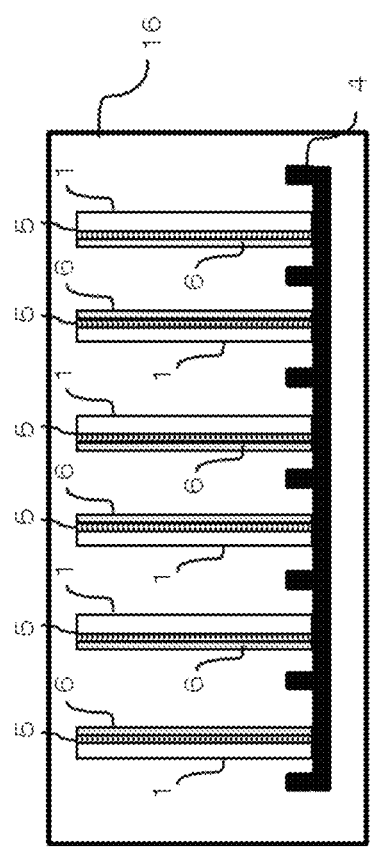
Figure 3iii

POLYSILOXANE, MATERIAL FOR SEMICONDUCTOR, AND PREPARATION METHOD FOR SEMICONDUCTOR AND SOLAR CELL

TECHNICAL FIELD

The present invention relates to a polysiloxane, a material for solar energy and a semiconductor, a preparation method for a semiconductor unit, and a solar cell, and specifically relates to organic synthesis of a series of polysiloxanes, a dopant material for solar energy and a semiconductor, a mask material, a preparation method for a semiconductor unit using the materials, and a solar cell.

BACKGROUND

In the conventional manufacturing for the semiconductor or solar cell, the method of using a gas dopant or a doped slurry when a p-type or n-type impurity diffusion layer is formed in the semiconductor substrate has been proposed. However, a barrier layer needs to be formed on the non-diffusion side for high temperature thermal diffusion using the above existing gas dopant or doped slurry, thereby resulting in a lengthy and complex process, and correspondingly increasing the costs. If an ion implantation method is used, both the required equipment costs and maintenance costs are high. Furthermore, it is difficult to achieve a powerful balance between the performances and costs of the existing slurry, so that it is non-competitive in the solar cell industry (reference [1]).

In particular, in the manufacturing process of two-sided cells in which both sides can generate power by receiving light, in the process of enabling the p-type and n-type impurities to diffuse into the semiconductor substrate used in the solar cells to form the impurity diffusion layer, different processes are used for the p-type impurity diffusion layer and the n-type impurity diffusion layer respectively. However, such a method has the problem of increasing steps. To solve these problems, a simpler method is proposed for forming a n-type impurity diffusion layer using a part of thermal processing products of the p-type impurity diffusion composition as a mask, after providing the p-type impurity diffusion composition containing a receptor element on the semiconductor substrate and forming the p-type impurity diffusion layer by thermal processing.

Furthermore, the gas dopant is generally a highly toxic substance, such as boron tribromide, phosphorane, or phosphorus oxychloride, has high requirements for pipes and tail gas absorption equipment, and it is likely to have a major accident in case of leakage, and pollutes the surrounding environment.

Patent Document [1]: Wei Qingzhu, Lu Junyu, Lian Weifei, Ni Zhichun, N-type double-sided battery and manufacturing method therefor: China, CN201510020649.4 [P]. 2015-01-15 [1].

SUMMARY

In order to overcome the defects of low yields caused by high costs of the existing semiconductor doping (including p-type and n-type doping solar cells), high toxicity and environmental pollution of employed dopant materials, and non-uniformity of doping, the present invention not only provides a polysiloxane, and a material for solar energy and a semiconductor prepared from the polysiloxane, but also provides a manufacturing process of a semiconductor unit and a solar cell using the material which is used for a solar cell and a semiconductor.

The present invention discloses a polysiloxane containing at least one segment selected from a molecular structure shown by formula 1,

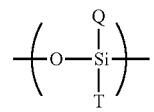

Formula 1 wherein in formula 1, Q is an alkyl containing an alcoholic hydroxyl and having less than 12 carbon atoms in the main chain, or an alkyl containing an alcoholic hydroxyl and having less than 12 non-hydrogen atoms in the main chain and containing a heteroatom; and T is a hydroxyl, an alkyl, an alkyl containing an alcoholic hydroxyl and having less than 12 carbon atoms in the main chain, or an alkyl containing an alcoholic hydroxyl and having less than 12 non-hydrogen atoms in the main chain and containing a heteroatom.

In consideration of increasing water solubility, and improving uniformity of boron distribution by complexing with boron, the Q is preferably a structural segment shown by formula 2,

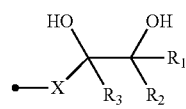

Formula 2 wherein in formula 2, X is an alkyl having less than 7 carbon atoms, or an alkyl having less than 7 non-hydrogen atoms in the main chain and containing a heteroatom; $R_1$, $R_2$, and $R_3$ are each independently a hydrogen atom, or a substituent having less than 3 carbon atoms, or the $R_2$ binds to a carbon atom on the X to form a cyclic substituent.

In order to facilitate thermal decomposition of the polysiloxane, and make the silicon content enable a barrier property and a diffusivity in an inhibiting gas to satisfy the requirements, the X is preferably an alkyl having less than 7 non-hydrogen atoms in the main chain and containing a heteroatom.

As used herein, the "diffusion in a gas" means that in a diffusion process, a diffusant component in a doped slurry or a mask material volatilizes to its surrounding gas, and diffuses to the gas.

In consideration of the water solubility, and in order to ensure that the silicon content enables the barrier property and the diffusivity in an inhibiting gas to satisfy the requirements, preferably, the $R_1$, $R_2$, and $R_3$ are each independently a hydrogen atom, or a substituent having 1 carbon atom, or the $R_2$ binds to a carbon atom on the X to form a cyclic substituent. Further preferably, the $R_1$, $R_2$, and $R_3$ are each independently a hydrogen atom.

The polysiloxane preferably further contains at least one segment selected from a molecular structure shown by formula 3 at a molar content of 1 to 99%,

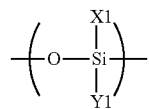

Formula 3 wherein in formula 3, X1 is an alkyl having less than 8 carbon atoms, or an aryl having less than 10 carbon atoms; and Y1 is a hydroxyl, an aryl having less than 10 carbon atoms, or an alkyl having less than 8 carbon atoms.

In consideration of both the solubility in an organic solvent, and maintaining the solubility in water to a certain degree, the molar content of the molecular structure segment shown by formula 2 is preferably 1 to 50%.

In consideration of the costs, and maintaining the water solubility using the hydrophilicity of hydroxyl, the Y1 is preferably a hydroxyl.

In consideration of increasing the water solubility, and improving the uniformity of boron distribution by complexing with boron, the T is preferably a hydroxyl, an alkyl having less than 8 carbon atoms, or a structure shown by formula 4,

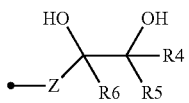

Formula 4 wherein in formula 4, Z is an alkyl having less than 7 carbon atoms, or an alkyl having less than 7 non-hydrogen atoms in the main chain and containing a heteroatom; $R_1$, $R_2$, and $R_3$ are each independently a hydrogen atom, or a substituent having less than 3 carbon atoms, or the $R_5$ binds to a carbon atom on the Z to form a cyclic substituent.

In order to facilitate thermal decomposition of the polysiloxane, and make the silicon content enable the barrier property and the diffusivity in an inhibiting gas to satisfy the requirements, the Z is preferably an alkyl having less than 7 non-hydrogen atoms in the main chain and containing a heteroatom.

In order to make the silicon content in the polysiloxane enable the barrier property and the diffusivity in an inhibiting gas to satisfy the requirements, the T is preferably a hydroxyl.

Since epoxyethane polymerization leads to reduced storage stability, the polysiloxane is preferably free of an epoxyethane structure.

In order to obtain a good solubility in water and a good solubility in an organic solvent, the polysiloxane preferably only includes the molecular structure segment shown by formula 1 and formed by Q (a molecular structure segment shown by formula 2).

Since a single molecule has better uniformity, the molecular structure segments are preferably identical molecular structure segments.

Because the molecular weight is very high, the overall solubility is reduced, and colloidization tends to occur, the polysiloxane preferably has a weight average molecular weight of 500 to 50,000.

Considering that local non-uniformity will not be caused even if the molecular weight is increased in storage and use, the polysiloxane preferably has a weight average molecular weight of 1,000 to 11,000.

In consideration of extending the shelf life, the polysiloxane preferably has a weight average molecular weight of 1,500 to 5,500.

The polysiloxane of the present invention is not specifically limited, and following examples may be enumerated. The actual arrangement mode of repeating structure units is not limited to the structure illustrated hereinafter.

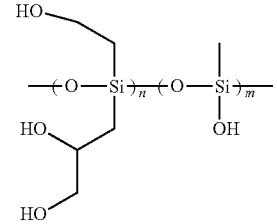

(A001)

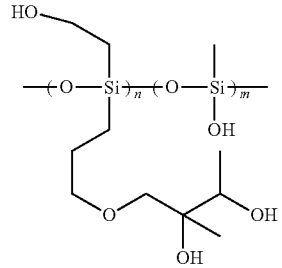

(A002)

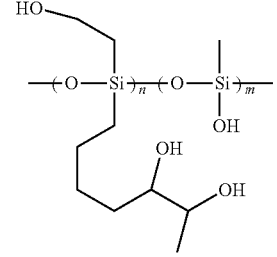

(A003)

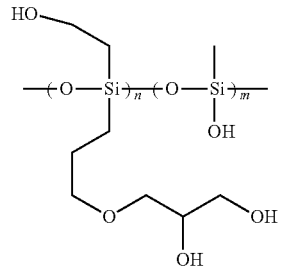

(A004)

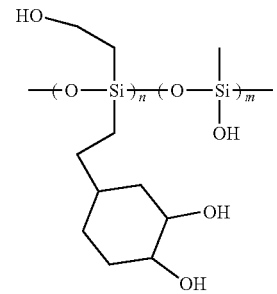

(A005)

(A006)
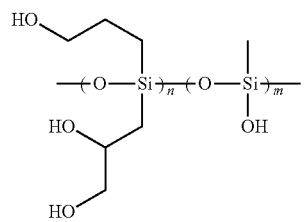
(A007)
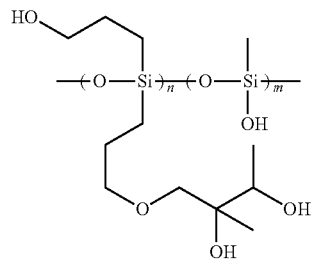
(A008)
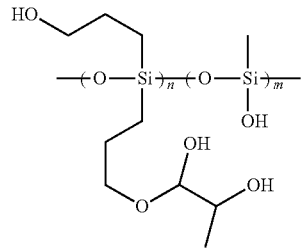
(A009)
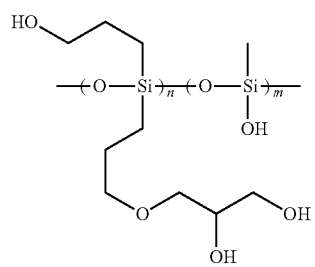
(A010)
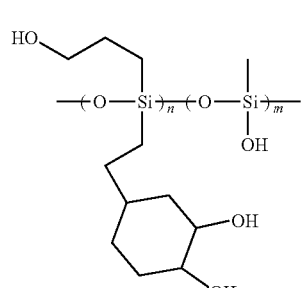
(A011)
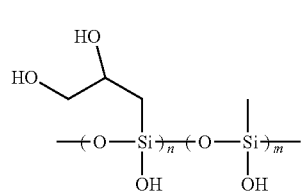
(A012)
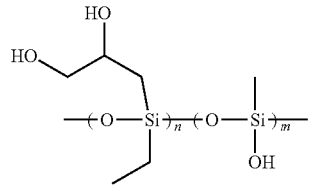
(A013)
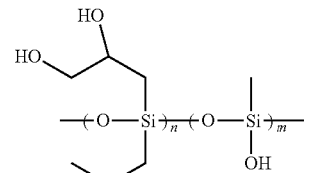
(A014)
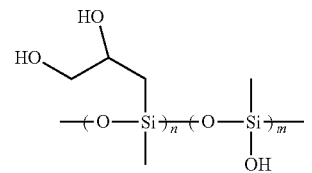
(A015)
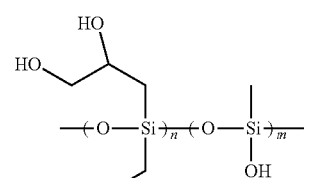
(A016)
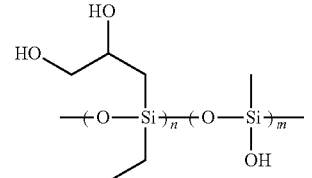
(A017)
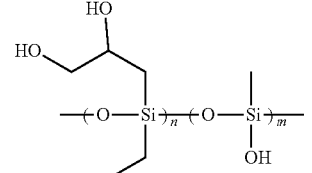
(A018)
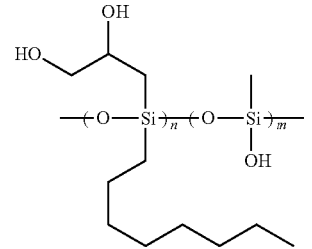

-continued
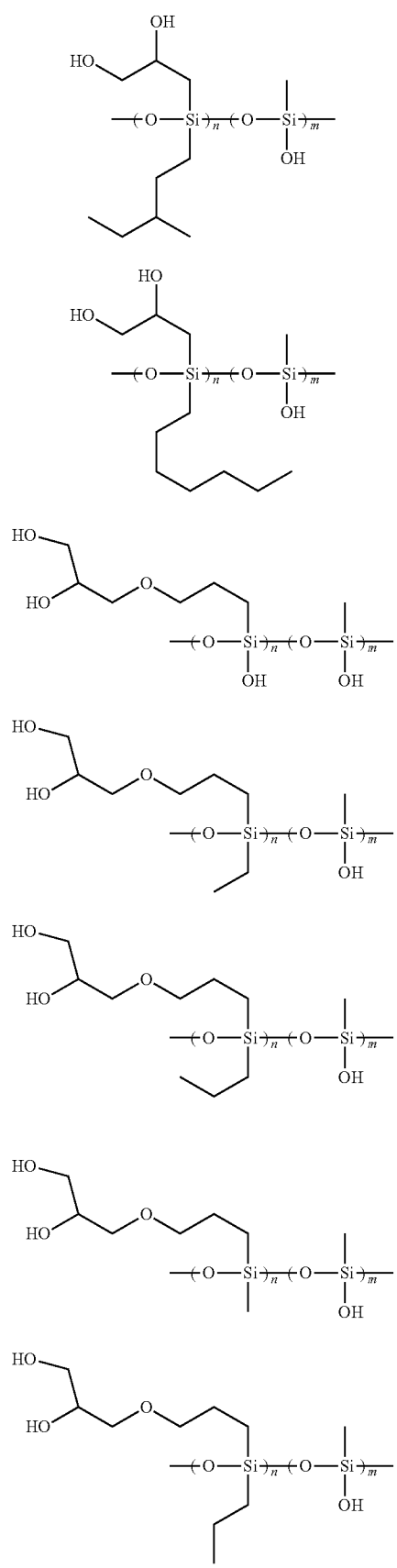
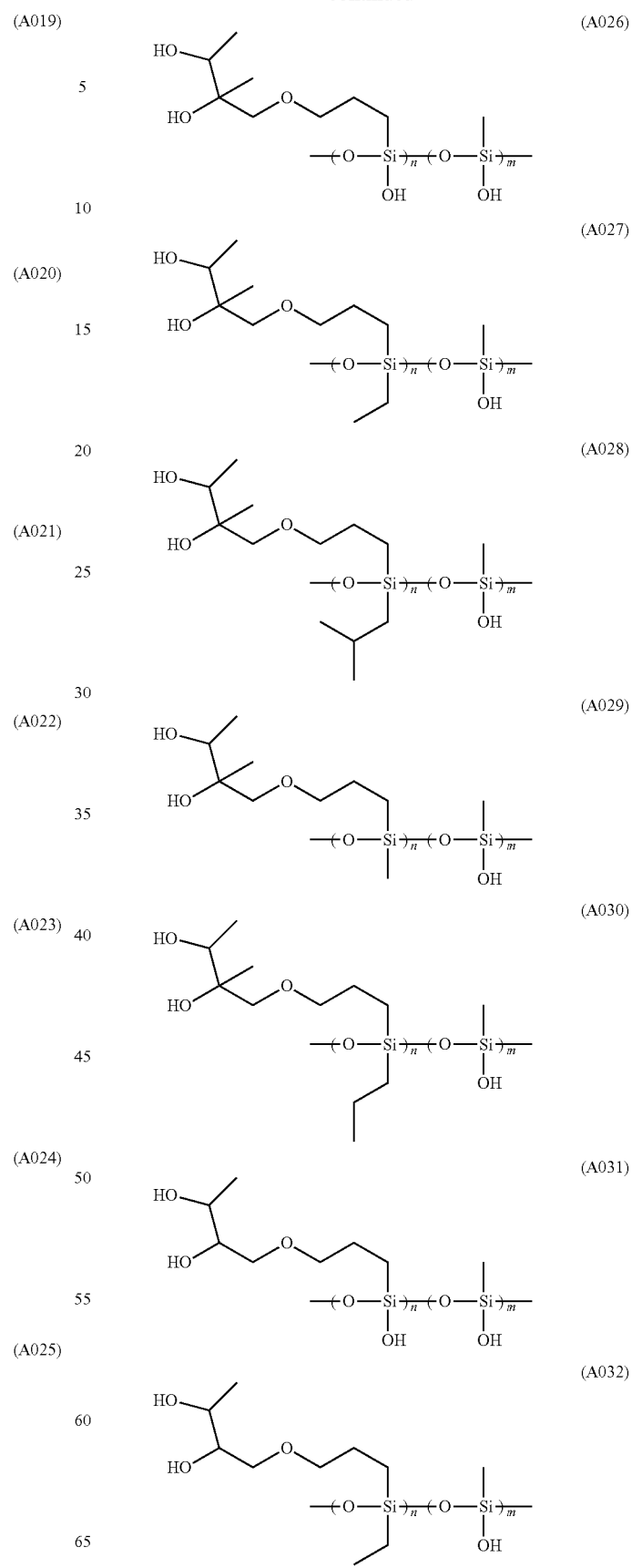

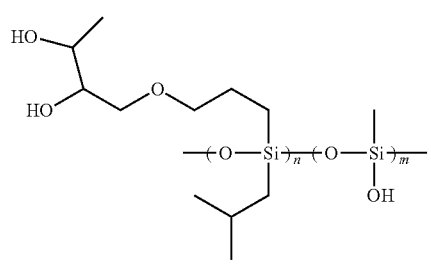
(A033)
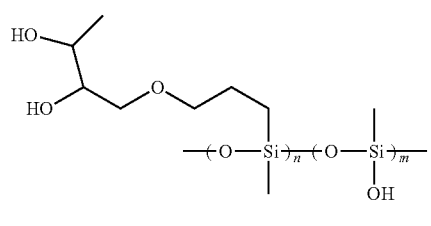
(A034)
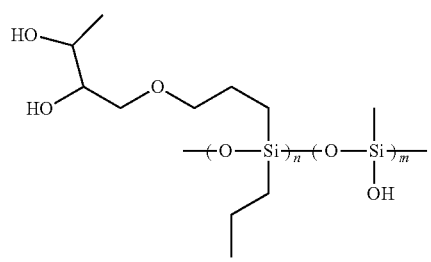
(A035)
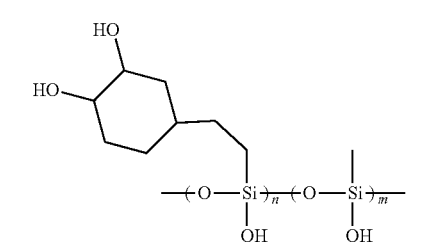
(A036)
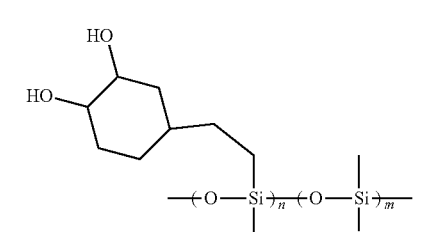
(A037)
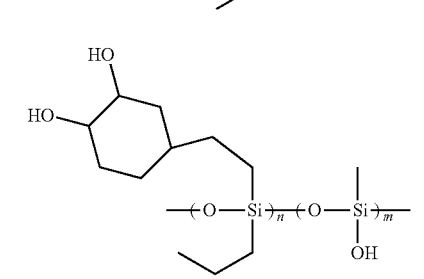
(A038)
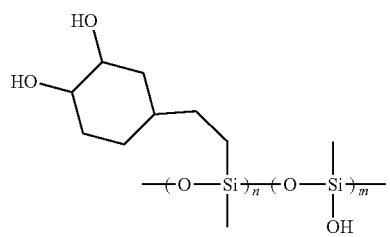
(A039)
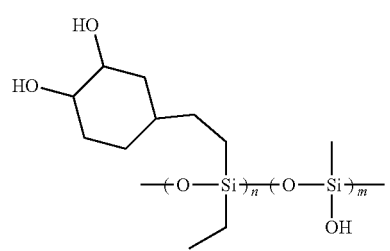
(A040)
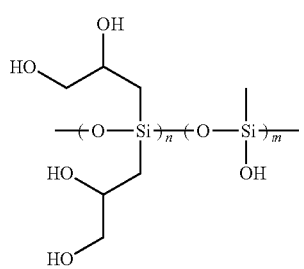
(A041)
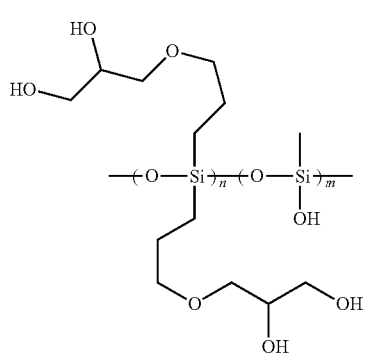
(A042)
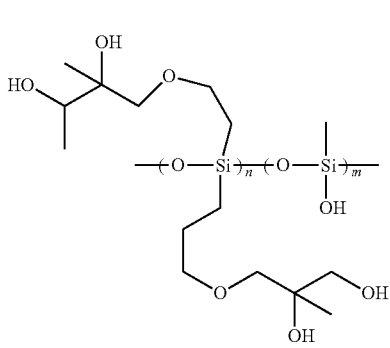
(A043)

(A044)
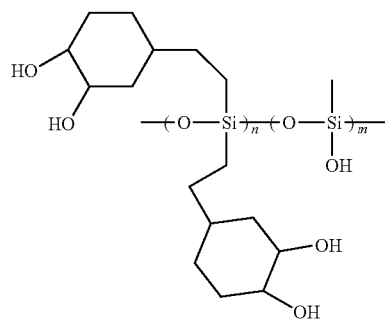
(A045)
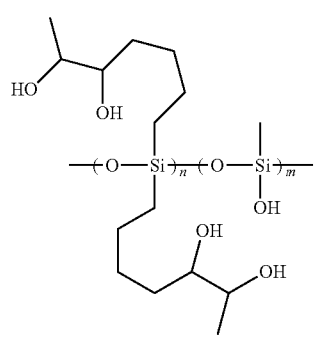
(A046)
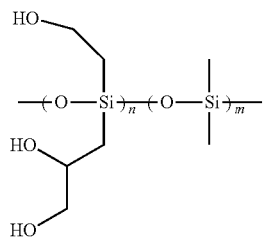
(A047)
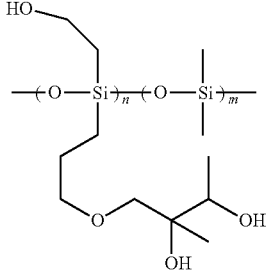
(A048)
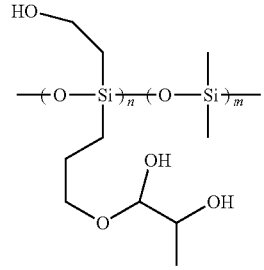
(A049)
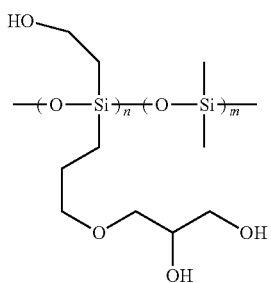
(A050)
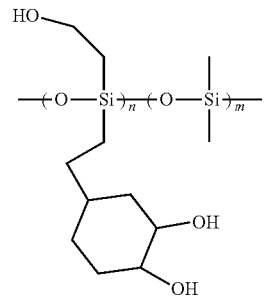
(A051)
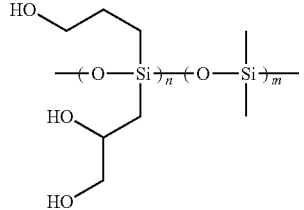
(A052)
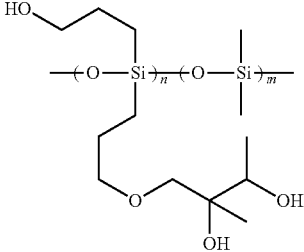
(A053)
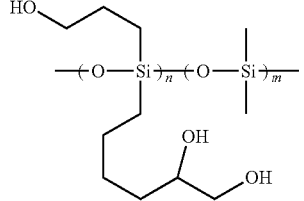
(A054)
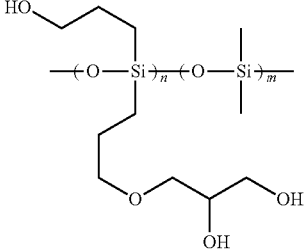

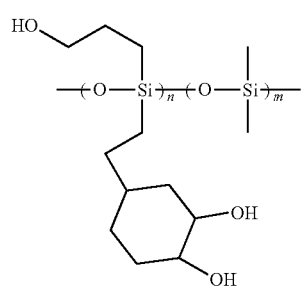
(A055)
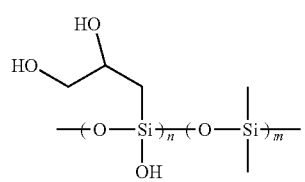
(A056)
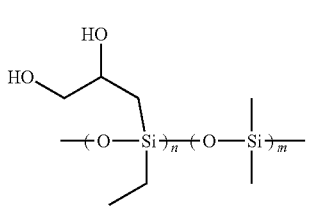
(A057)
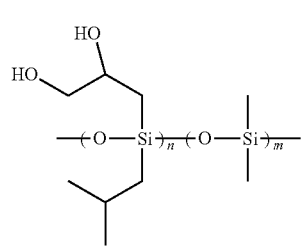
(A058)
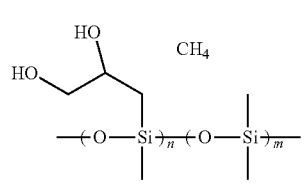
(A059)
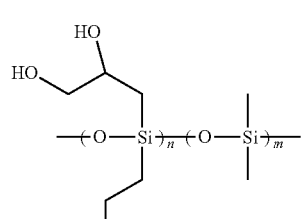
(A060)
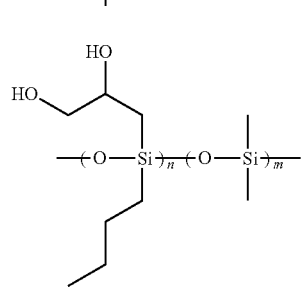
(A062)
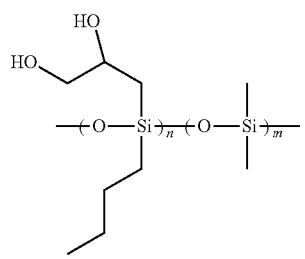
(A062)
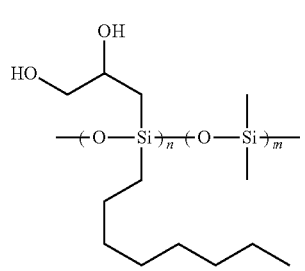
(A063)
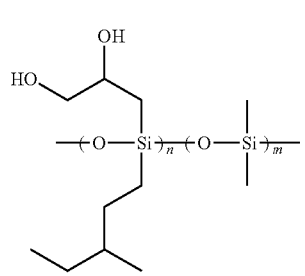
(A064)
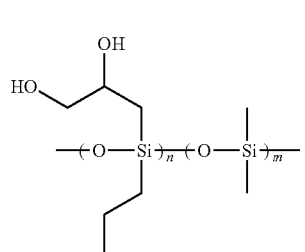
(A065)
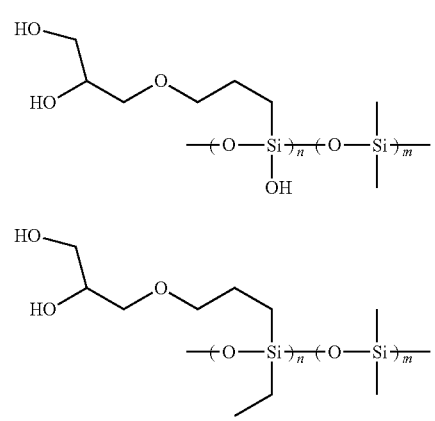
(A066)
(A067)

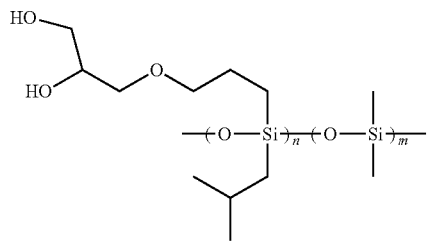
(A068)
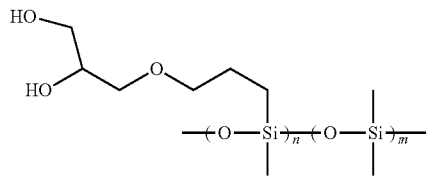
(A069)
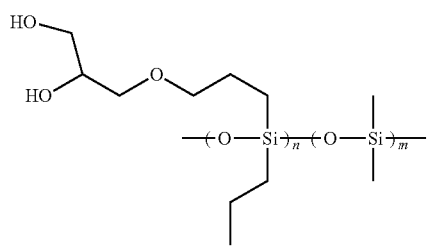
(A070)
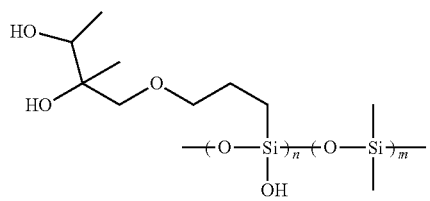
(A071)
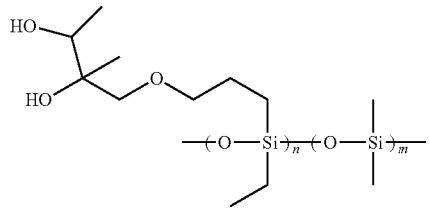
(A072)
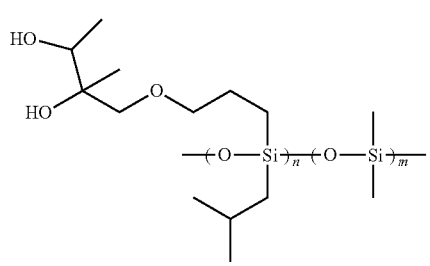
(A073)
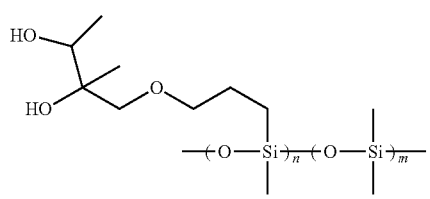
(A074)
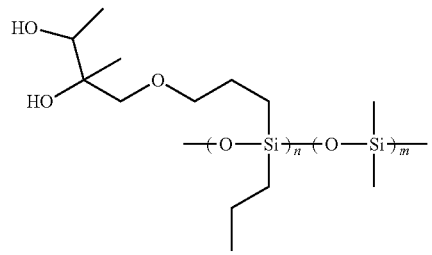
(A075)
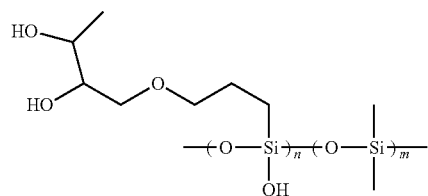
(A076)
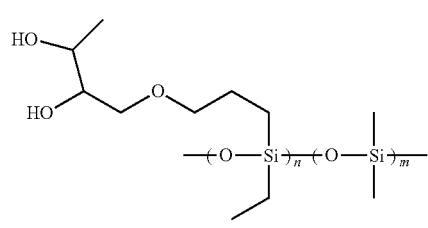
(A077)
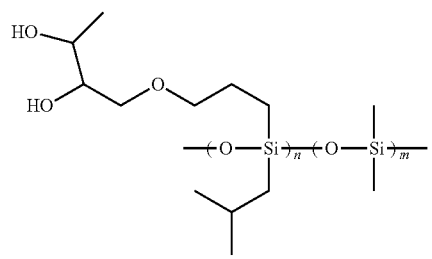
(A078)
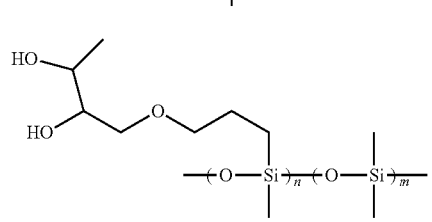
(A079)
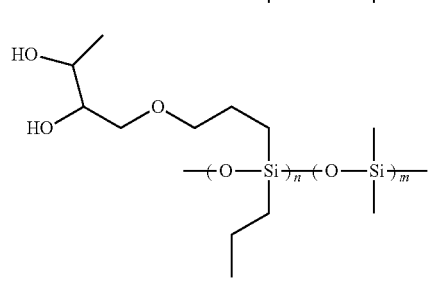
(A080)
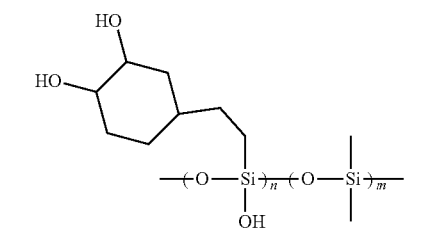
(A081)

(A082) 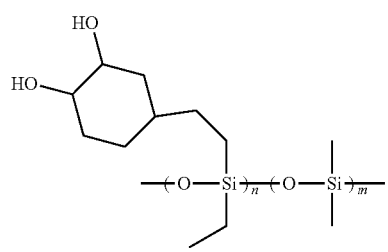
(A083) 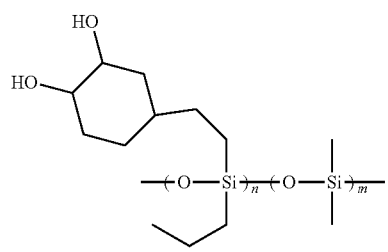
(A084) 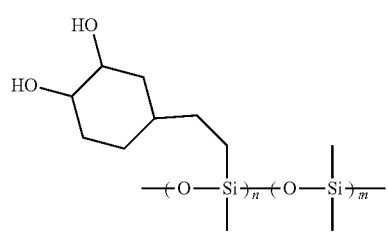
(A085) 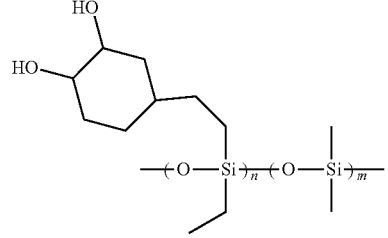
(A086) 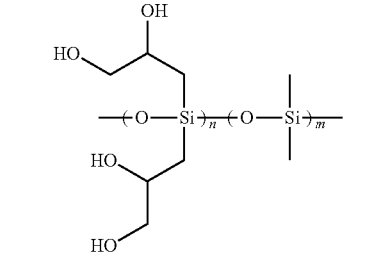
(A087) 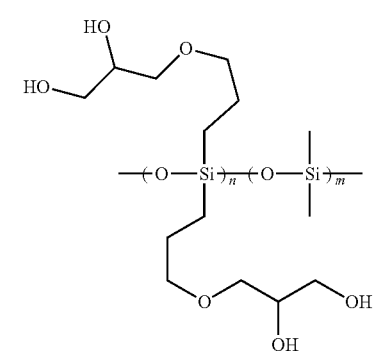
(A088) 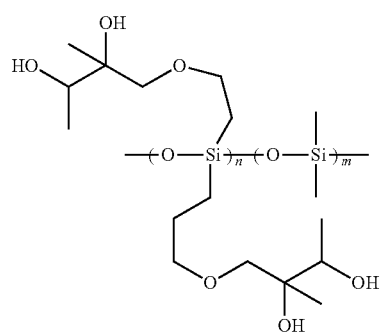
(A089) 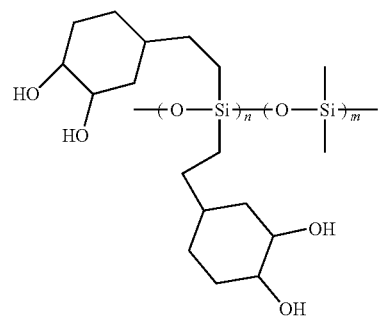
(A090) 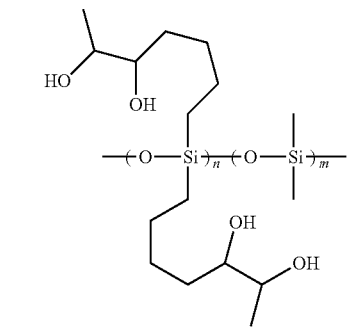
(A091) 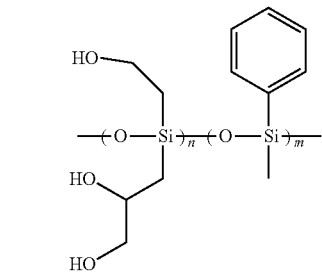
(A092) 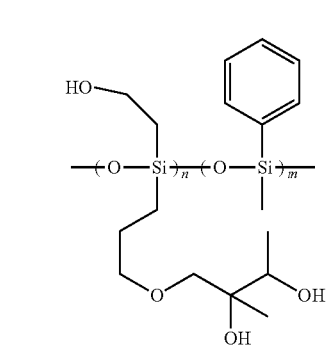

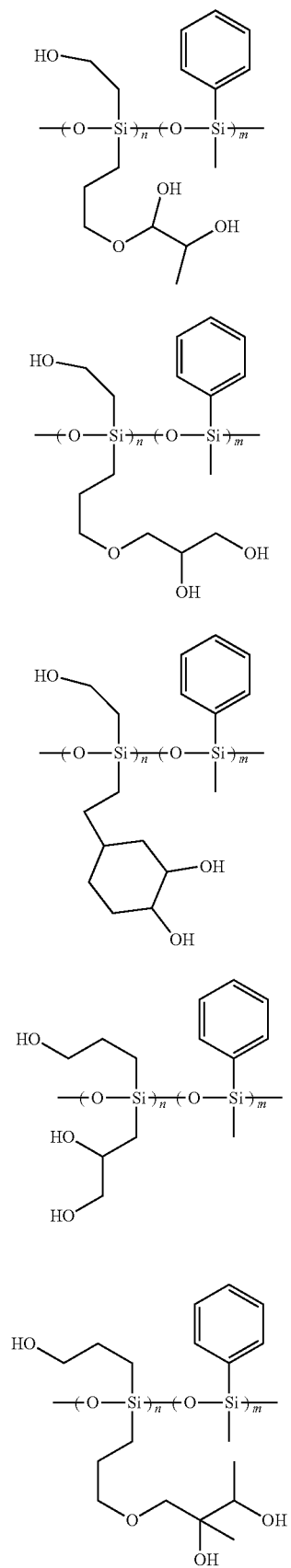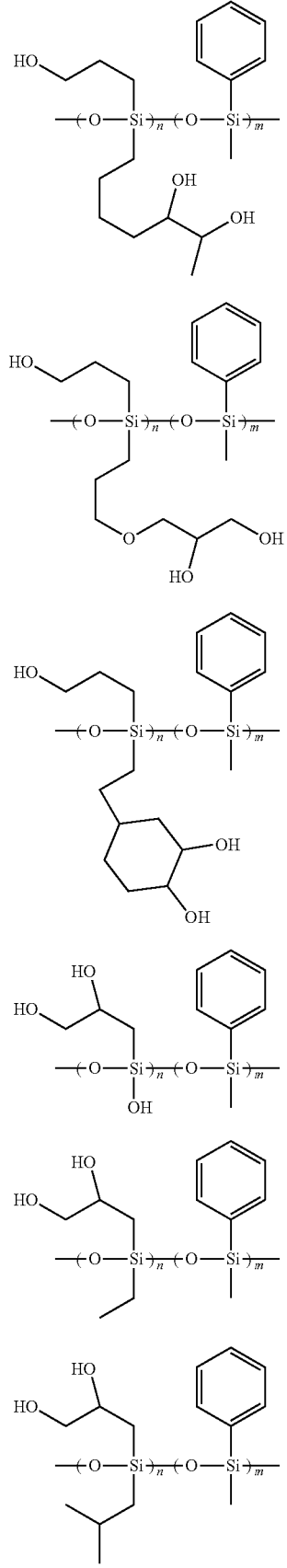

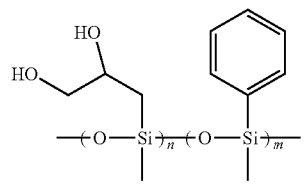 (A104)
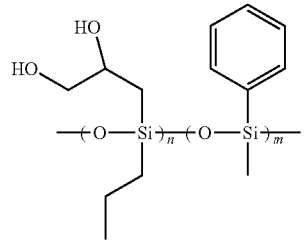 (A105)
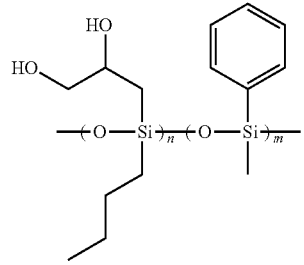 (A106)
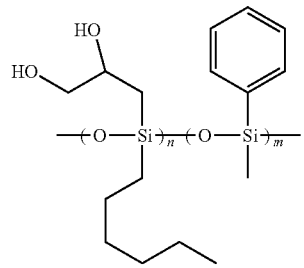 (A107)
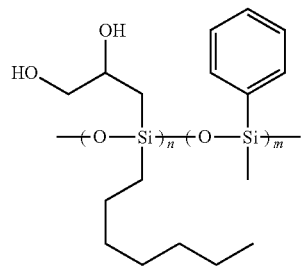 (A108)
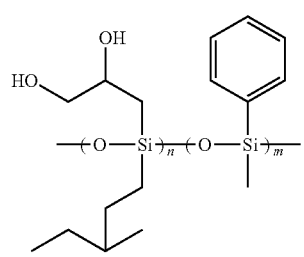 (A109)
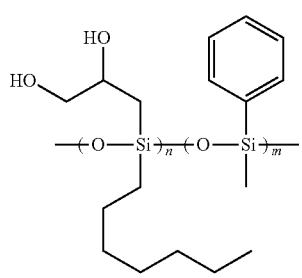 (A110)
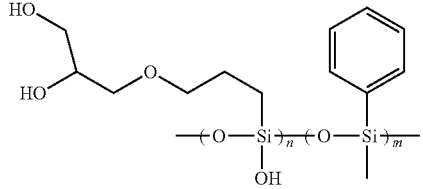 (A111)
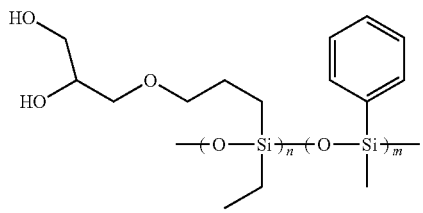 (A112)
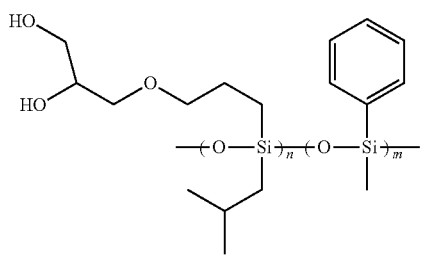 (A113)
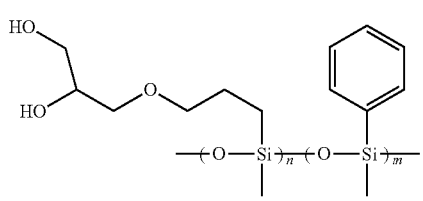 (A114)
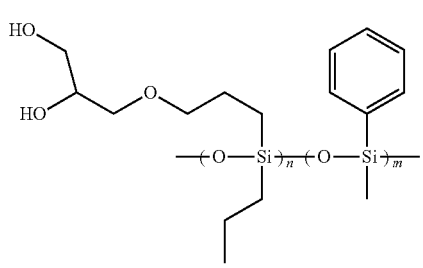 (A115)
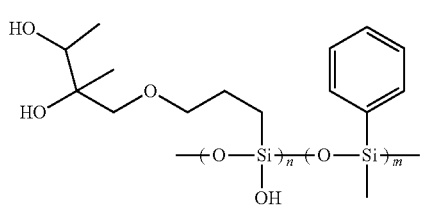 (A116)

-continued (A117)–(A123): chemical structures shown on page 23.

(A124)–(A130): chemical structures shown on page 24.

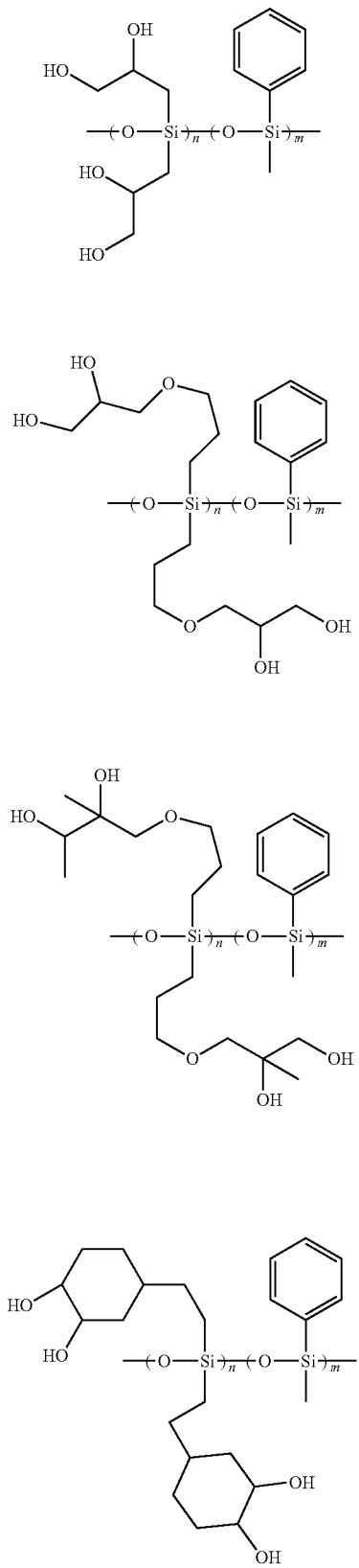
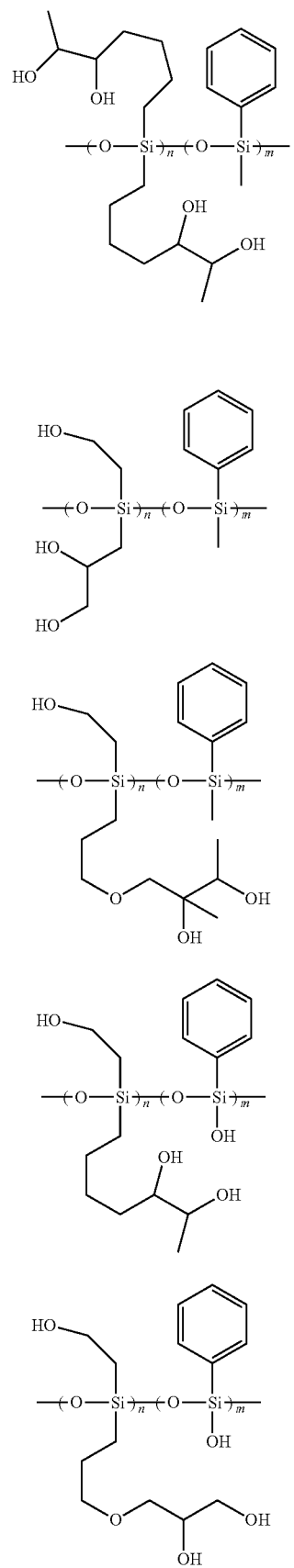

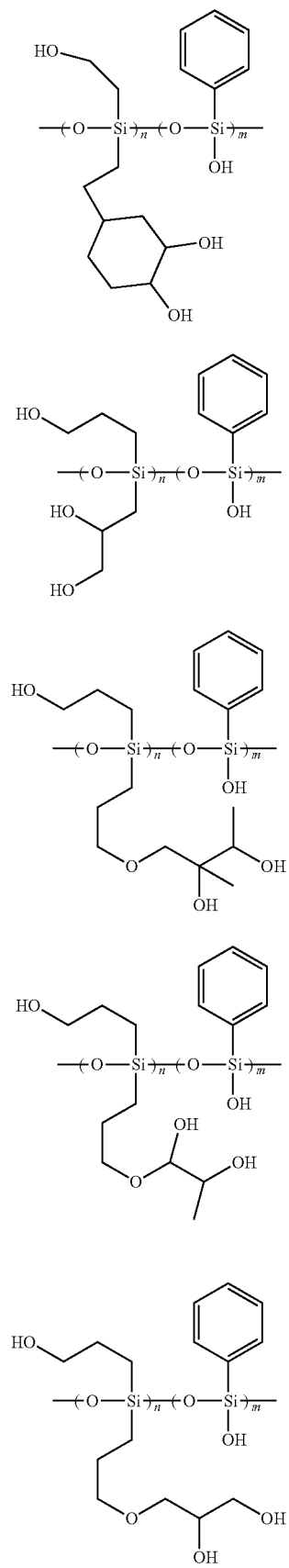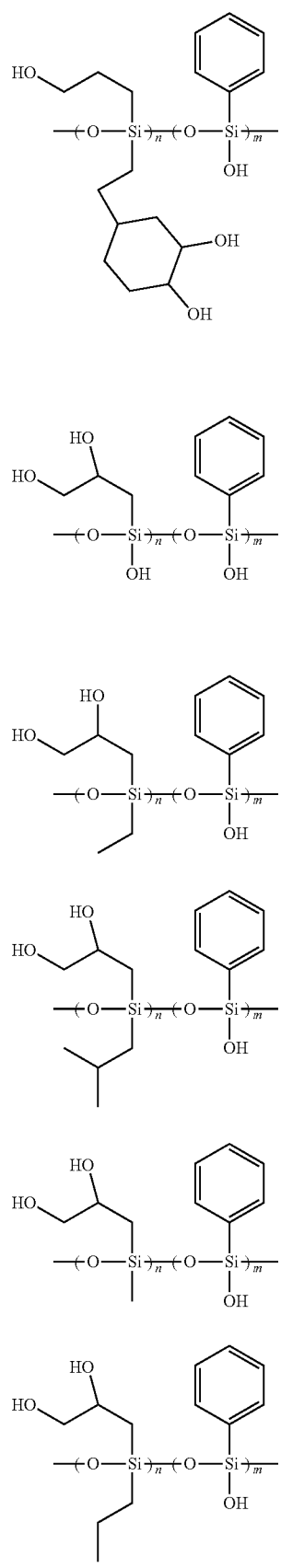

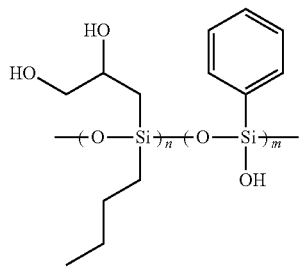
(A151)
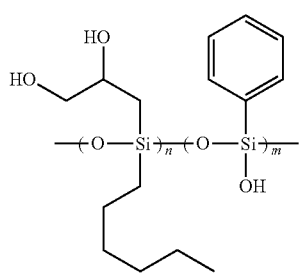
(A152)
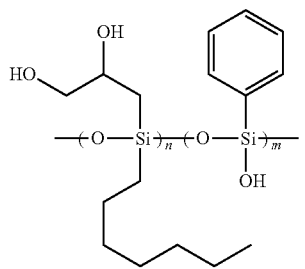
(A153)
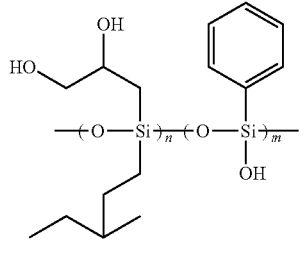
(A154)
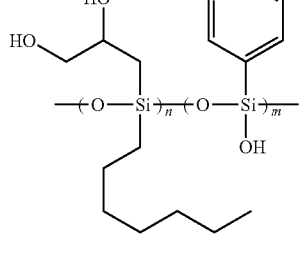
(A155)
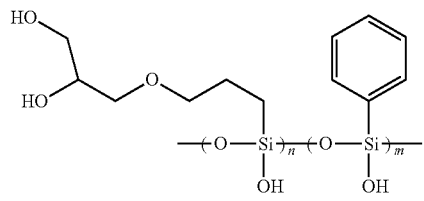
(A156)
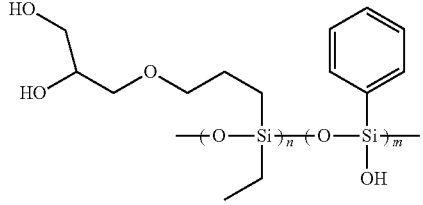
(A157)
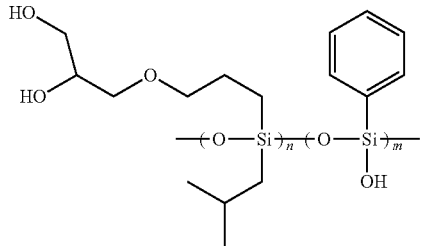
(A158)
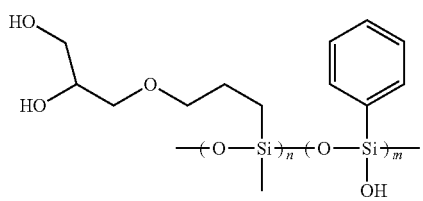
(A159)
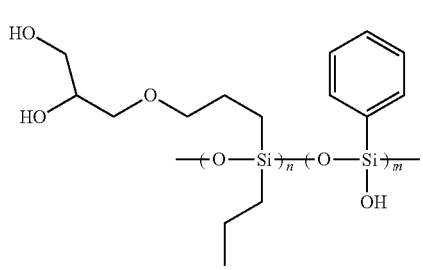
(A160)
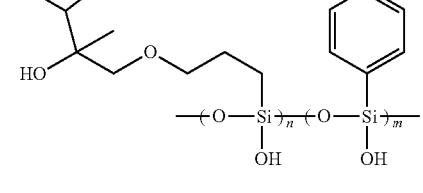
(A161)
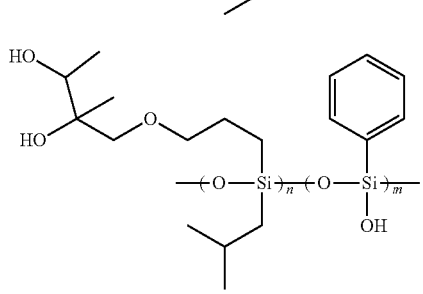
(A162)
(A163)

-continued
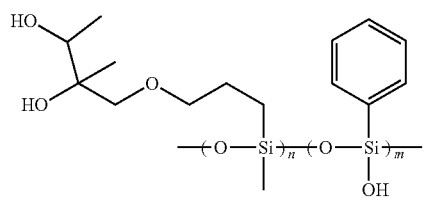
(A164)
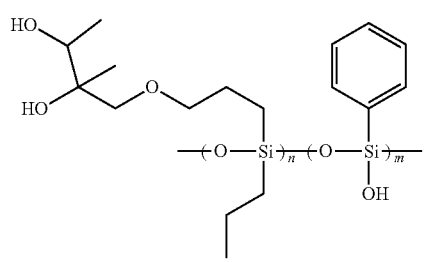
(A165)
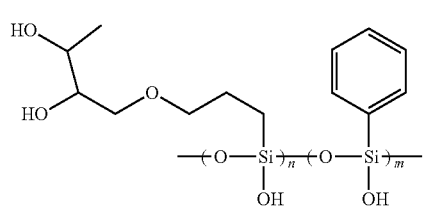
(A166)
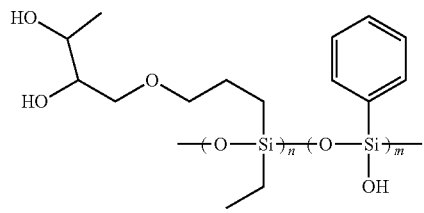
(A167)
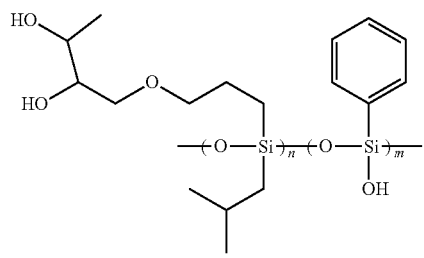
(A168)
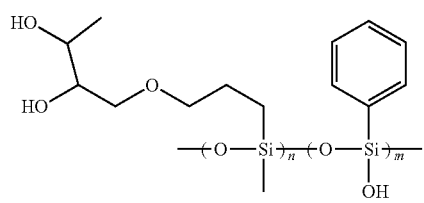
(A169)
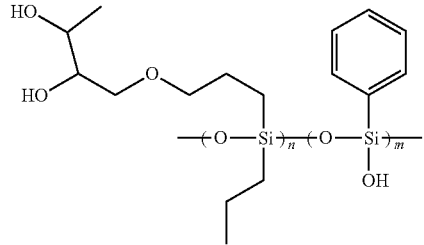
(A170)
-continued
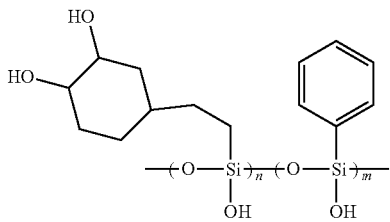
(A171)
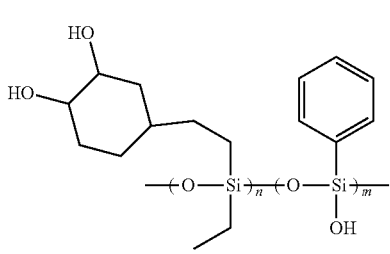
(A172)
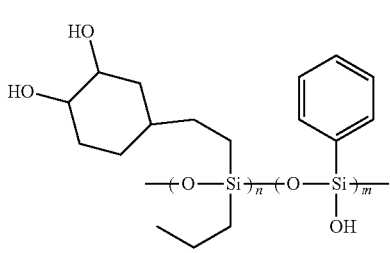
(A173)
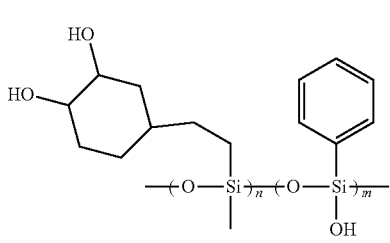
(A174)
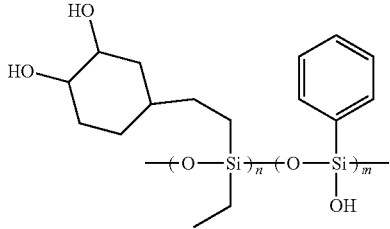
(A175)
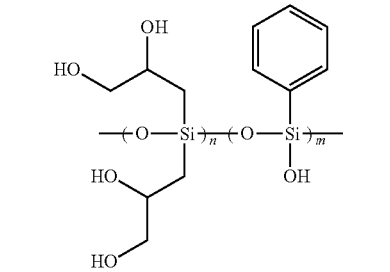
(A176)

-continued
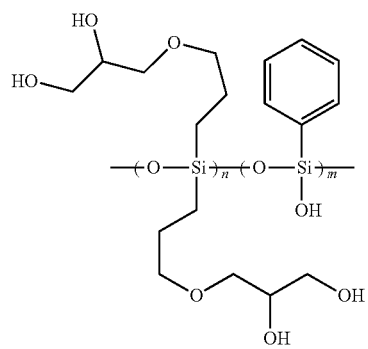
(A177)
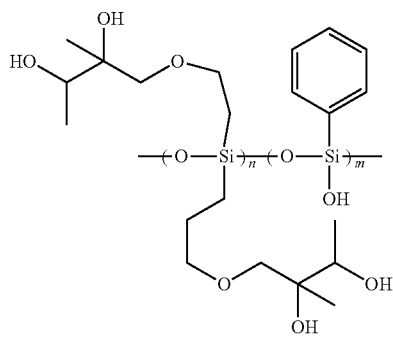
(A178)
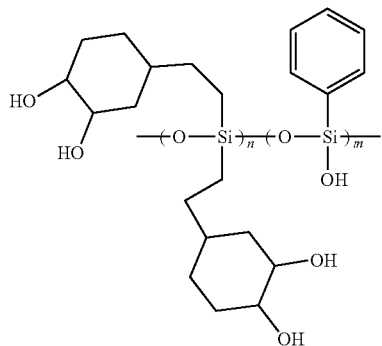
(A179)
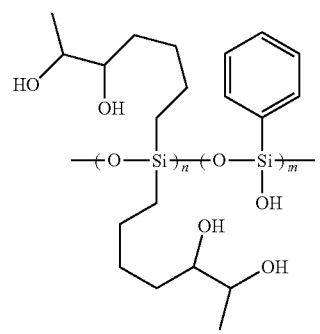
(A180)
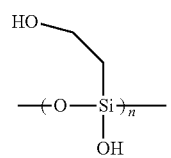
(A181)
-continued
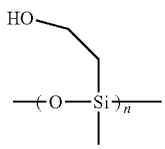
(A182)
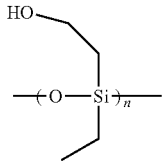
(A183)
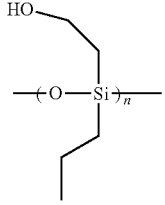
(A184)
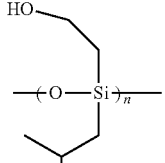
(A185)
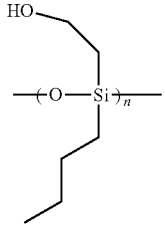
(A186)
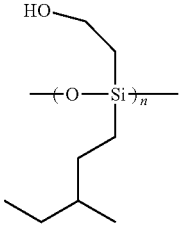
(A187)
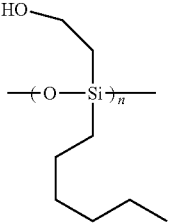
(A188)

-continued
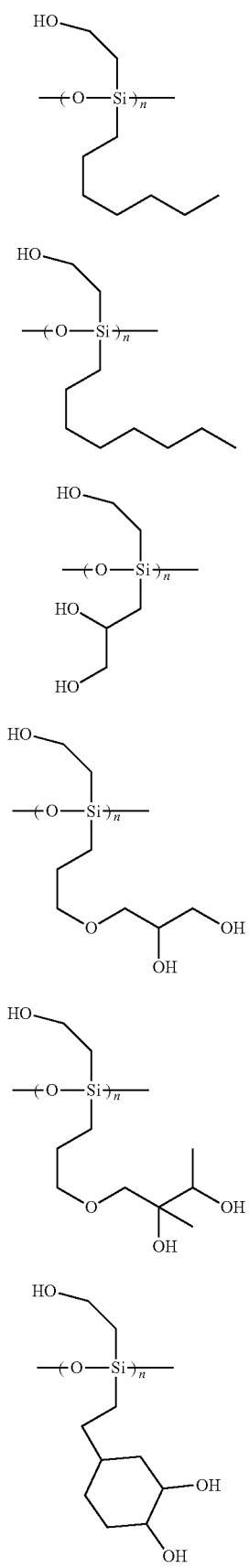
(A189)
(A190)
(A191)
(A192)
(A193)
(A194)
-continued
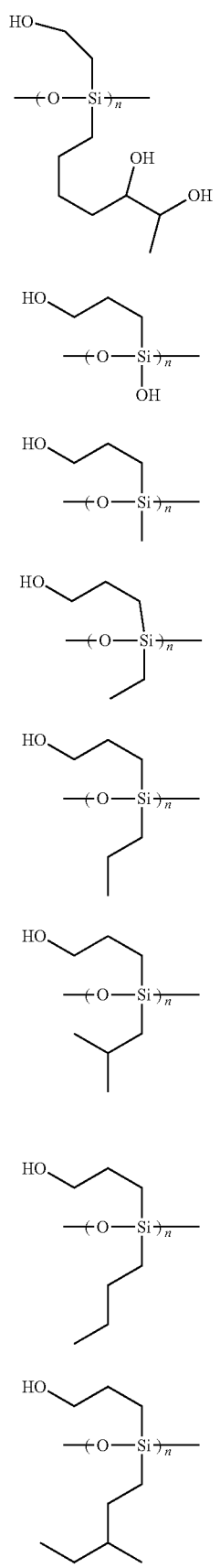
(A195)
(A196)
(A197)
(A198)
(A199)
(A200)
(A201)
(A202)

-continued
(A203)
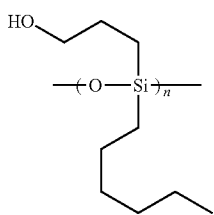
(A204)
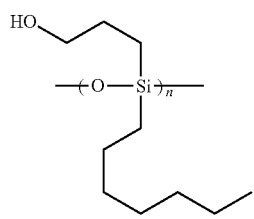
(A205)
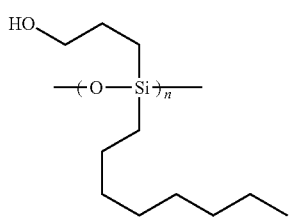
(A206)
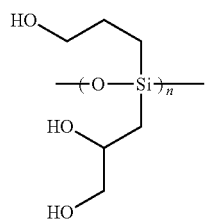
(A207)
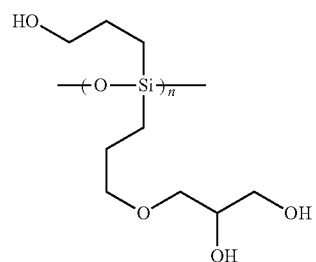
(A208)
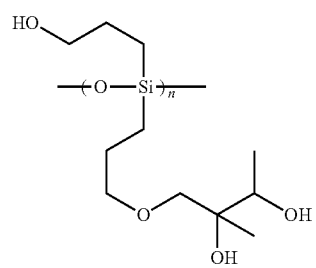
-continued
(A209)
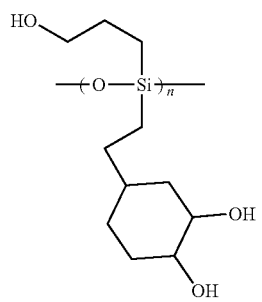
(A210)
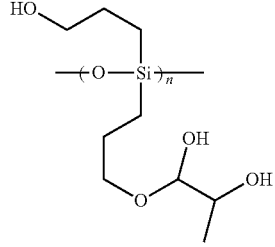
(A211)
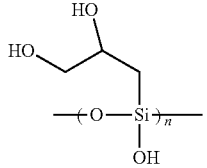
(A212)
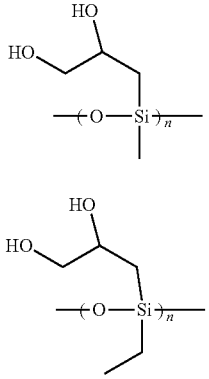
(A213)
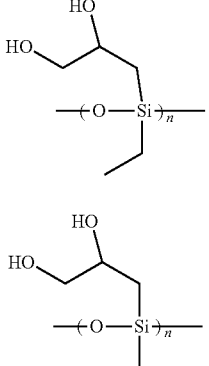
(A214)
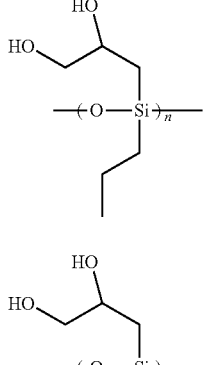
(A215)
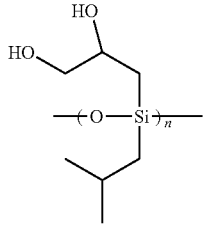

-continued
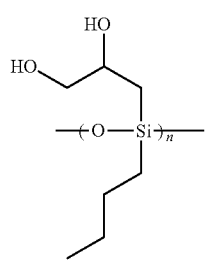
(A216)
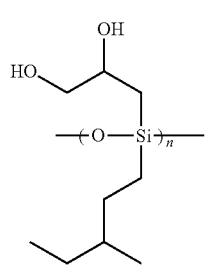
(A217)
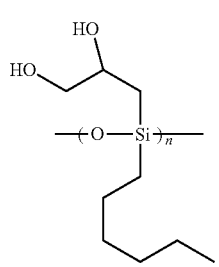
(A218)
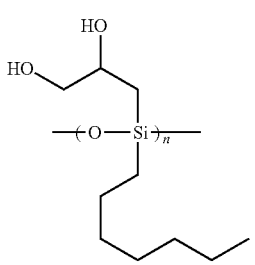
(A219)
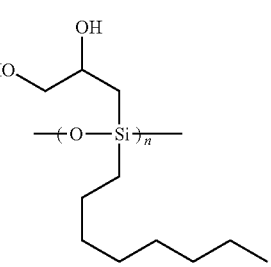
(A220)
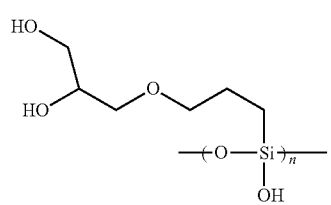
(A221)
-continued
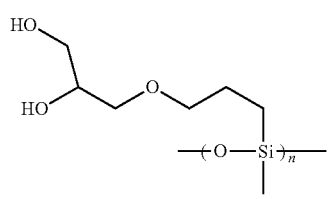
(A222)
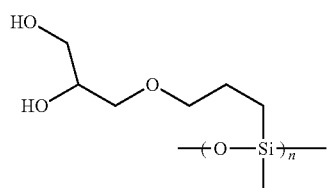
(A223)
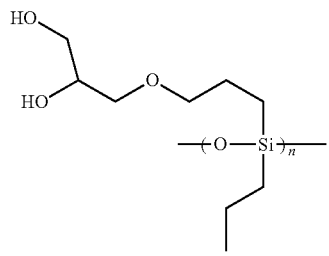
(A224)
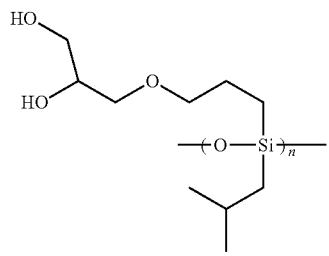
(A225)
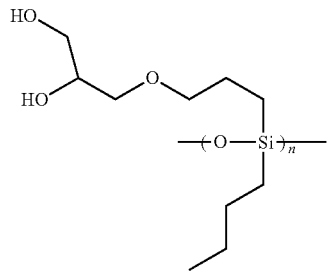
(A226)
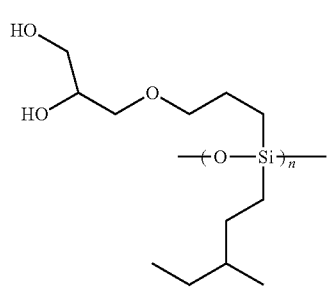
(A227)

-continued
(A228)
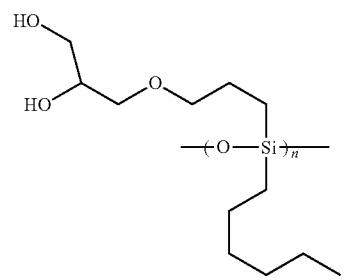
(A229)
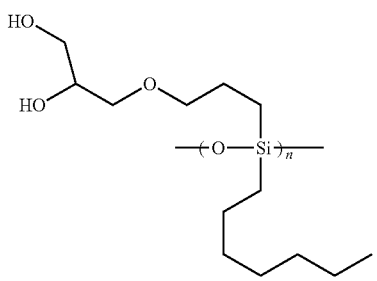
(A230)
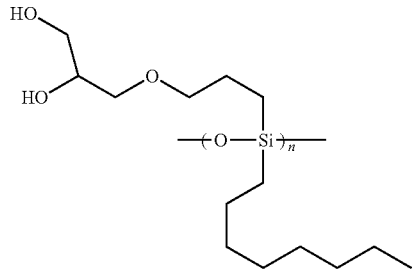
(A231)
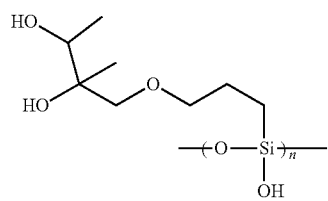
(A232)
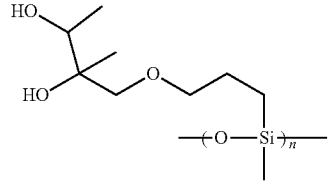
(A233)
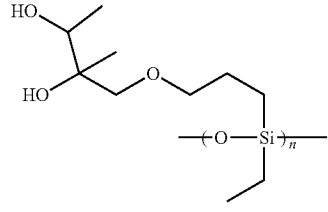
-continued
(A234)
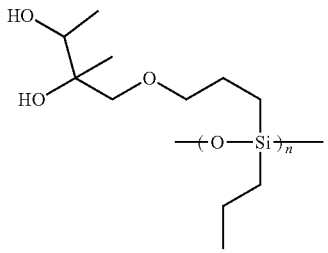
(A235)
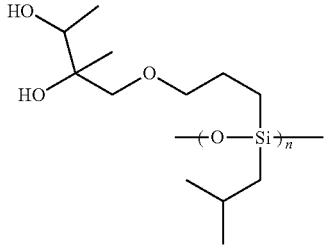
(A236)
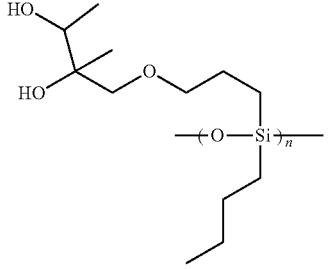
(A237)
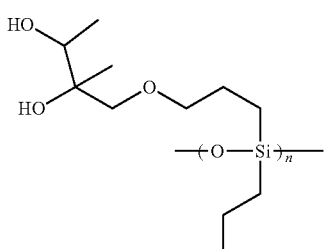
(A238)
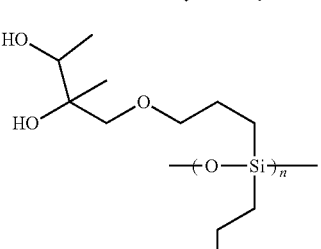
(A239)
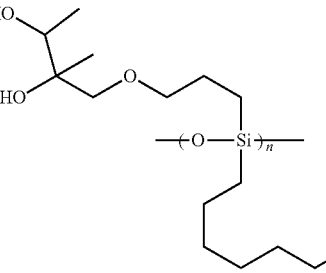

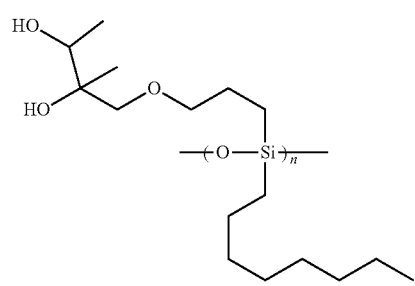
(A240)
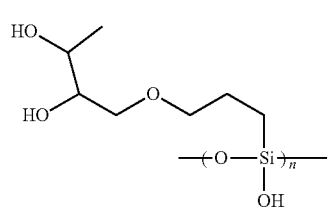
(A241)
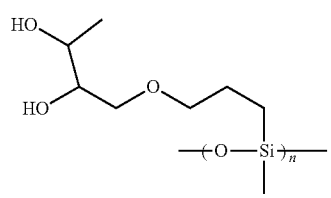
(A242)
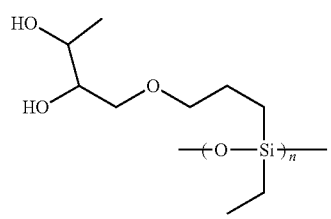
(A243)
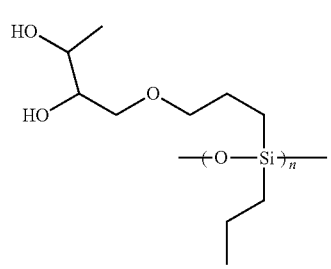
(A244)
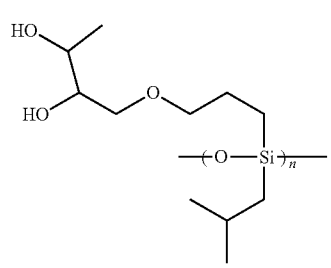
(A245)
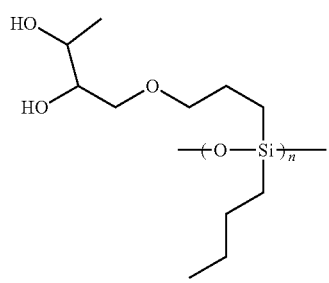
(A246)
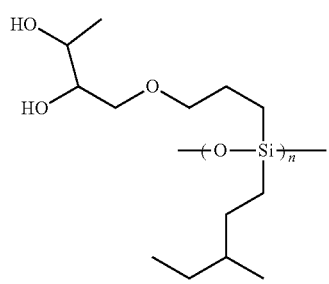
(A247)
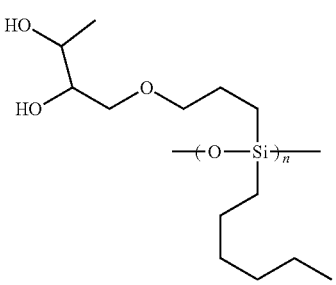
(A248)
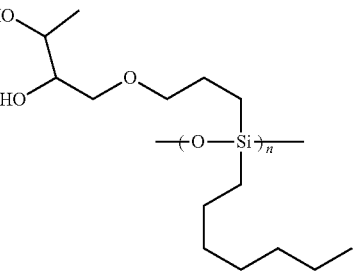
(A249)
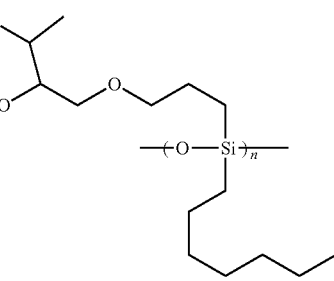
(A250)
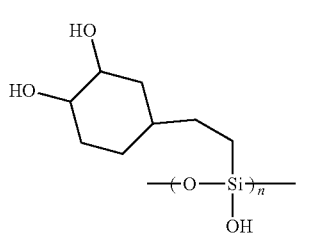
(A251)

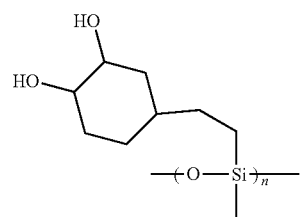
(A252)
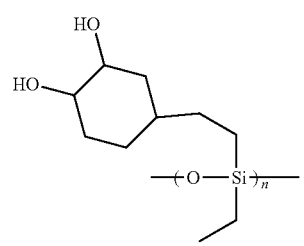
(A253)
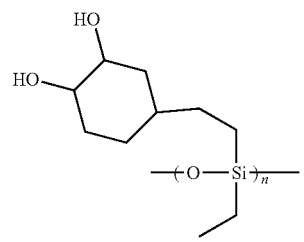
(A254)
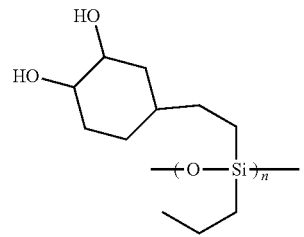
(A255)
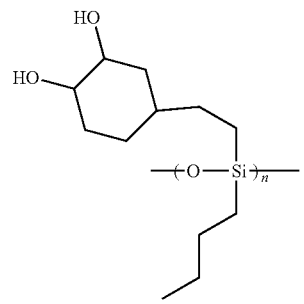
(A256)
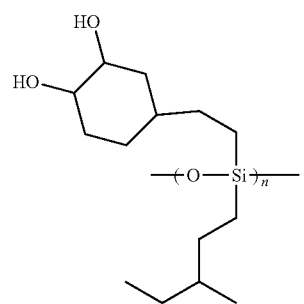
(A257)
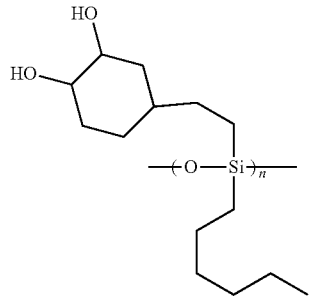
(A258)
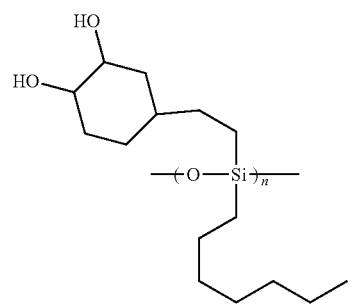
(A259)
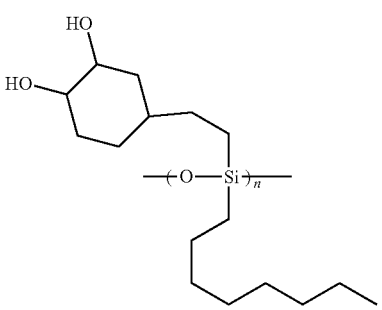
(A260)
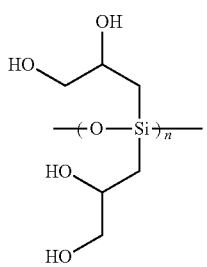
(A261)
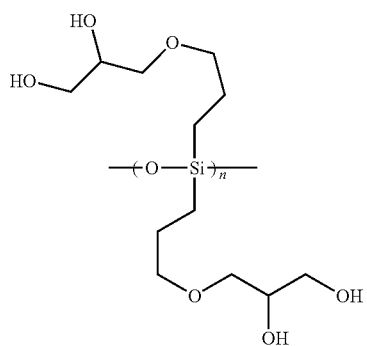
(A262)

(A263)
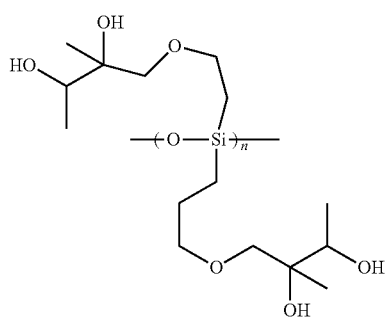

(A264)
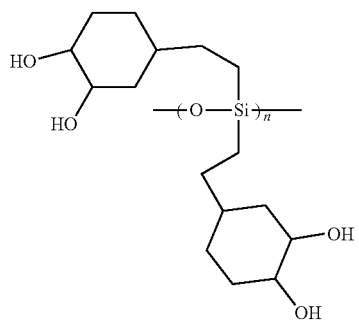

(A265)
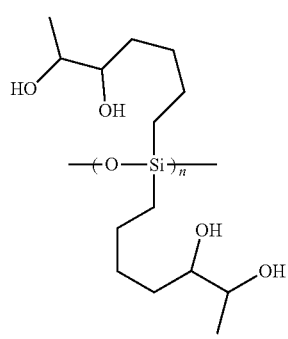

(A266)
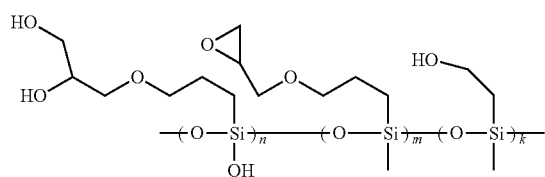

The present invention further discloses a material for solar energy and a semiconductor (also referred to as "the material of the present invention" hereinafter), containing the polysiloxane hereinbefore.

The material for solar energy and a semiconductor may further contain a dopant component A, a polymer binder B, and a solvent C.

The material for solar energy and a semiconductor of the present invention, when used as a mask material, may also be free of the dopant component A.

The dopant component A is not specifically limited. Preferably, the dopant component A is an n-type dopant component of a compound containing an element of a 5th main group, or a p-type dopant component of a compound containing an element of a 3rd main group.

Due to low costs and abundant sources, the dopant component A preferably contains an inorganic boron compound component, or an inorganic phosphorus compound component.

In consideration of the safety and low costs of use, further preferably, the inorganic boron compound contained in the dopant component A is diboron trioxide or boric acid, and the inorganic phosphorus compound is phosphoric acid.

In order to enable the dopant component to be uniformly distributed, a molecular structure repeating unit of the polymer binder B preferably contains an alcoholic hydroxyl.

In order to be better applied to spin coating and printing coating, the polymer binder B preferably has a weight average molecular weight in a range of 1,000 to 300,000. In order to facilitate thermal decomposition and apply to spin coating, the polymer binder B further preferably has a weight average molecular weight in a range of 3,000 to 50,000.

The polymer binder is not specifically limited, and is preferably polyallyl alcohol or polyvinyl alcohol.

In consideration of increasing the solubility of polyvinyl alcohol or polyallyl alcohol in a solvent, the solvent C preferably includes 0 to 50% water and 50 to 100% organic solvent.

In order to be better applied to spin coating and printing coating, the organic solvent is preferably an organic solvent having a boiling point of 50 to 300° C.

The organic solvent is not specifically limited, and is preferably 1-methoxy-2-propanol, diacetone alcohol, 2-propanol, n-butanol, 3-methoxy-3-methylbutanol, diethylene glycol methyl ethyl ether, propylene glycol, diethylene glycol monobutyl ether, dipropylene glycol monomethyl ether, alpha-terpineol, diethylene glycol monomethyl ether, diethylene glycol, methanol, ethanol, 1,4-dioxane, acetone, butanone, methyl lactate, ethyl lactate, or the like.

In consideration of the storage stability and cost control of the material for solar energy and a semiconductor, a total addition amount of the dopant component A, the polymer binder B, the polysiloxane, and the solvent C is preferably 2 to 30% relative to a total mass of a slurry. In consideration of further improving the storage stability and cost control of the slurry, the total addition amount of the dopant component A, the polymer binder B, the polysiloxane, and the solvent C is further preferably 5 to 20% relative to the total mass of the slurry.

The present invention further discloses a method for manufacturing a semiconductor unit on a semiconductor substrate, in which the material for solar energy and a semiconductor is used.

The method includes following steps a to c, a. coating the material of the present invention on one side of each semiconductor substrate as a first conductive type impurity diffusion composition, to form a first conductive type impurity diffusion composition film, b. heating the semiconductor substrate on which the first conductive type impurity diffusion composition film obtained in the step a is formed, to enable the first conductive type impurity contained in the dopant component A of the material to diffuse into the semiconductor substrate, so as to form a first conductive type impurity diffusion layer, and c. heating the semiconductor substrate in an atmosphere of a gas containing a second conductive type impurity, to enable the second conductive type impurity to diffuse into the semiconductor substrate, so as to form a second conductive type impurity diffusion layer.

In the step b and the step c, respective sides on which the first conductive type impurity diffusion composition films of the semiconductor substrates, with two pieces in each group are formed are oppositely placed. In the step b and the step c, placing the respective sides on which the first conductive type impurity diffusion composition films of the semiconductor substrates with two pieces in each group are formed oppositely, is to reduce pollution of uncoated sides by the dopant component and pollution to the first conductive type impurity diffusion surfaces during diffusion of the second conductive type impurity.

In order to further prevent pollution to the first conductive impurity diffusion surface by the second conductive type impurity, the step c is preferably carried out using a thermal processing product of the first conductive type impurity diffusion composition film as a mask after the step b.

In order to shorten the process, and save costs, the step c is preferably carried out after the step b and in succession to the step b.

In order to reduce the influence on the first conductive type diffusion layer, in the step c, a heating temperature when forming the second conductive type impurity diffusion layer is preferably 50 to 200° C. which is lower than a temperature when forming the first conductive type impurity diffusion layer.

In order to adjust a surface concentration of the first conductive type impurity and the second conductive type impurity in the semiconductor substrate, the method preferably further includes a step d: oxidizing surface of the semiconductor substrate in an oxygen-containing atmosphere.

In order to shorten the process, and reduce costs, the step d is preferably carried out after the step c and in succession to the step c.

In order to reduce the second conductive type impurity from entering a first conductive type diffusion surface, while enabling the second conductive type impurity to uniformly deposit on a second conductive type diffusion surface, preferably, in the step b and the step c, for a plurality of groups of the semiconductor substrates with two pieces in each group, a distance between the sides on which the first conductive type impurity diffusion composition films in each group are formed is W1, a distance between the sides opposite to the sides on which the first conductive type impurity diffusion composition films are formed in adjacent two groups is W2, and W1 and W2 satisfy W1<W2.

In order to further reduce the second conductive type impurity from entering the first conductive type diffusion surface, preferably, when a plurality of pieces of the semiconductor substrates is configured in the step b and the step c, the distance W1 between the sides on which the first conductive type impurity diffusion composition films of the semiconductor substrates with two pieces in each group are formed is 0 mm.

In order to enable an organic substance in the material for solar energy and a semiconductor to fully decompose, and improve a barrier property of the formed first conductive type impurity diffusion composition film on the second conductive type impurity, the step b is preferably carried out in an oxygen-containing atmosphere.

In order to reduce the process instability caused by switching the atmosphere, and to save time for stabilization required for switching the atmosphere, a ratio of nitrogen to oxygen in the atmosphere in the step b is preferably identical to a ratio of nitrogen to oxygen in an atmosphere in the step c.

In order to reduce the effect on the first conductive type diffusion layer, preferably, the first conductive type is a p-type, and the second conductive type is an n-type.

The present invention further discloses a solar cell prepared according to the method for manufacturing a semiconductor unit.

The present disclosure has following beneficial effects:

First, the polysiloxane provided by the present invention not only has a good solubility in an organic solvent, but also has an improved solubility in water, thereby expanding the scope of application.

Secondly, the material for solar energy and a semiconductor prepared from the polysiloxane provided by the present invention not only has good diffusivity, but also can reduce costs to some extent, has a good barrier property, and may be suitable for a mask material having a doping function. In a boron, or phosphorus diffusion process of a semiconductor (including a solar cell), a target result can be obtained without an additional mask layer, while achieving the goal of shortening the process and reducing costs.

Thirdly, the material free of a dopant prepared from the polysiloxane provided by the present invention can be applicable to a diffusion process expected to have no doping at a mask.

Fourthly, the manufacturing process using the semiconductor unit and the solar cell provided by the present invention can further utilize the material for solar energy and a semiconductor. The process not only utilizes the excellent barrier property and excellent diffusivity of the material, but also further enhances the inhibition of diffusion of the dopant component A to an area outside the material for solar energy and a semiconductor of the present invention (i.e., diffusion in a gas) during doping, by improving the manufacturing process, and shortens the number of processes and process time.

BRIEF DESCRIPTION OF THE DRAWINGS

FIGS. 3*i* to 3*iii* including FIGS. 3*i*, 3*ii* and 3*iii*, are sectional views of a schematic process of an example of a method for manufacturing a semiconductor unit according to the present invention.

FIG. 3*i* is a sectional view of a semiconductor substrate with a first conductive type impurity diffusion composition film formed on one side.

FIG. 3*ii* is a sectional view of a placement mode of the semiconductor substrate in a diffusion boat, with a first conductive type impurity diffusion composition film formed on one side.

FIG. 3*iii* is a sectional view of the semiconductor substrate in FIG. 3*ii* after thermal diffusion.

FIG. 5*i* is a sectional view of an n-type semiconductor substrate.

FIG. 5*ii* is a sectional view of a semiconductor substrate with a p-type impurity diffusion composition film formed on one side.

FIG. 5*iii* is a sectional view of the semiconductor substrate in FIG. 5*ii* after p-type impurity diffusion.

FIG. 5*iv* is a sectional view after n-type impurity diffusion on the basis of FIG. 5*iii*.

FIG. 5*v* is a sectional view of the semiconductor substrate in FIG. 5*iv* after washing.

FIG. 5vi is a sectional view of the semiconductor substrate in FIG. 5v after preparing an anti-reflecting layer and passivation layer thereon.

FIG. 5vii is a sectional view of the semiconductor substrate in FIG. 5vi after preparing an electrode thereon.

DESCRIPTION OF REFERENCE NUMERALS IN THE DRAWINGS

Figure 2:
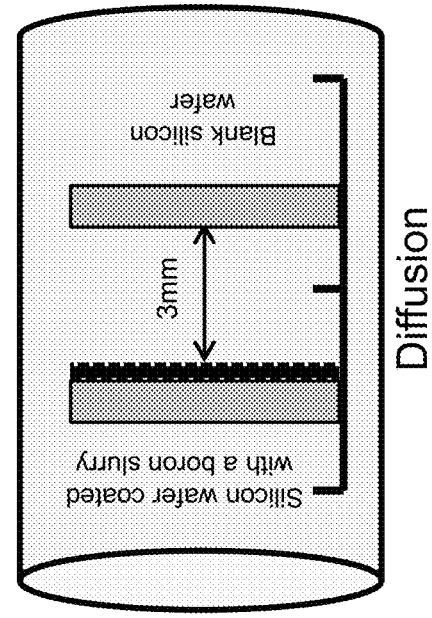
FIG. 2 is a silicon wafer placement mode in an evaluation test of diffusivity property and diffusion in a gas.

1 Semiconductor substrate
2 First conductive type impurity diffusion composition film
3 Semiconductor substrate with a first conductive type impurity diffusion composition film formed on one side
4 Diffusion boat
5 First conductive type impurity diffusion layer
6 A thermal processing product layer of a first conductive type impurity diffusion composition film
7 n-type semiconductor substrate
8 p-type impurity diffusion composition film
9 p-type impurity diffusion layer
10 Thermal processing product of a p-type impurity diffusion composition film
11 Phosphorosilicate glass layer
12 n-type impurity diffusion layer
13 Anti-reflecting layer and passivation layer
14 p-electrode
15 n-electrode
16 Diffusion furnace

DETAILED DESCRIPTION OF EMBODIMENTS

The present invention will be described hereinafter by referring to the preferred embodiments. The embodiments are only used for illustration, and do not limit the invention. The essential contents of the present invention do not necessarily have all characteristics described in the embodiments.

A polysiloxane repeating unit structure of the embodiment contains an alcoholic hydroxyl, which is suitable for (but not limited to) the material for solar energy and a semiconductor according to the present invention. An alkoxy silane (1), an alkoxy silane (2), an organic solvent (3), water (4), and an acid catalyst (5) (see below) can be used in the synthesis of the polysiloxane, and the reaction can be monitored by testing the molecular weight using gel permeation chromatography (GPC) to determine the endpoint of the reaction. A material for solar energy and a semiconductor of the present invention prepared from the starting materials contains a dopant component (A), a polymer binder B, the polysiloxane, and a solvent (C). Chemicals involved in the synthesis of the polysiloxane of the embodiment, components in the material for solar energy and a semiconductor according to the present invention, a semiconductor manufacturing process using the materials, and a solar cell prepared by using the method are described hereinafter.

<<Alkoxy Silane (1)>>

The alkoxy silane (1) may include one or more kinds, but its molecular structure must contain an alcoholic hydroxyl, or a functional group (6) that can be fully hydrolyzed to generate an alcoholic hydroxyl after a reaction. As the functional group (6), an ester functional group, an epoxypropane functional group, an epoxybutane functional group, a readily hydrolyzable ether functional group, and the like can be enumerated.

As the alkoxy silane (1), 3-glycidyloxypropyltrimethoxysilane, 2-(3,4-epoxycyclohexyl) ethyltrimethoxysilane, 3-glycidyltrimethoxysilane, 3-(methacryloxy)propyltrimethoxysilylane, 3-(methacryloyloxy)propyltrimethoxysilane, triethoxy(3-glycidyloxypropyl)silane, diethoxy(3-glycidyloxypropyl)methylsilane, 3-glycidyloxypropyl(dimethoxy)methylsilane, [8-(glycidyloxy)-n-octyl]trimethoxysilane, and the like can be enumerated.

<<Alkoxy Silane (2)>>

The alkoxy silane (2) may include one or more kinds, but its molecular structure is free of the functional group (6) in the alkoxy silane (1).

As the alkoxy silane (2), phenyltrimethoxysilane, methyltrimethoxysilane, ethyltrimethoxysilane, vinyltrimethoxysilane, methylphenyldimethoxysilane, dimethyldimethoxysilane, diphenyldimethoxysilane, cyclohexyl methyl dimethoxy silane, and the like can be enumerated.

<<Organic Solvent (3)>>

The organic solvent (3) is an organic solvent which is not readily hydrolyzable in the presence of a strong acid at less than 110° C., it has more than 30 g solubility in 100 g water at room temperature, and it has a boiling point of higher than 110° C.

As the organic solvent (3), 1-methoxy-2-propanol, diacetone alcohol, 2-propanol, n-butanol, 3-methoxy-3-methylbutanol, diethylene glycol methyl ethyl ether, propylene glycol, diethylene glycol monobutyl ether, dipropylene glycol monomethyl ether, alpha-terpineol, diethylene glycol monomethyl ether, diethylene glycol, and the like can be enumerated.

<<Water (4)>>

The water (4) is used as a reactant involved in a hydrolysis reaction of the alkoxysilane (1) and the alkoxysilane (2), and may include tap water, deionized water, ultra pure water, and the like.

<<Acid Catalyst (5)>>

The acid catalyst (5) is used for hydrolysis reaction of the alkoxy silane (1) and the alkoxy silane (2), and includes a catalyst for polymerization of hydrolysates of the alkoxy silane (1) and the alkoxy silane (2). It not only has a good catalytic effect on hydrolysis of an alkoxy binding to silicon in the alkoxy silane (1) and the alkoxy silane (2), but also needs to have a catalytic effect on hydrolysis of a functional group (5), contained in an alkyl substituent binding to silicon in the alkoxy silane (1), that can be fully hydrolyzed to generate an alcoholic hydroxyl.

As the acid catalyst (5), hydrochloric acid, sulfuric acid, phosphoric acid (note: phosphoric acid is generally not used in the preparation of a p-type doped slurry), nitric acid, super strong acid, and the like can be enumerated.

<<Gel Permeation Chromatography (GPC)>>

Gel permeation chromatography (GPC) is used as a reaction monitoring method, and Shimazu S3-4100 is used as a gel permeation chromatographic instrument. Chromatographic column: TSKgel SuperHM-H, size: 6.0 mm I.D.×15 cm, part number 0018001, microparticle size: 3&5 µm. Test conditions: mobile phase: tetrahydrofuran, flow rate: 0.2 mL/min, column temperature: 40° C., single sample run time: 30 min. A standard sample used to make a standard curve is polystyrene.

<<Dopant Component (A)>>

The dopant component (A) is a compound commonly used in the manufacturing for a semiconductor (including a solar cell). The dopant component (A) is an n-type dopant component including a compound containing an element of a 15th group (also referred to as the "compound of the 15th group" herein), or a p-type dopant component including a compound containing an element of a 13th group (also referred to as the "compound of the 13th group" herein). As the compound of the 13th group contained in the p-type dopant component, $B(OH)_3$, $B_2O_3$, $Al_2O_3$, and the like can be enumerated. By including 1 or more of these compounds in the dopant component (A), a p-type or high-concentration p-type impurity diffusion layer may be formed in the semiconductor substrate, and the diffusion layer itself may also be used as a mask material for blocking pollution by other impurities. As the compound of the 15th group contained in the n-type dopant component, $H_3PO_4$, $P_2O_5$, $Bi_2O_3$, and the like can be enumerated. By including 1 or more of these compounds in the dopant component (A), an n-type or high-concentration n-type impurity diffusion layer may be formed in the semiconductor substrate, and the diffusion layer itself may also be used as a mask material for blocking pollution by other impurities.

<<Polymer Binder (B)>>

The polymer binder (B) has a function of uniformly distributing the dopant component in a solid component formed after drying the doped slurry and the mask material, and this contributes to more uniform doping on the target semiconductor substrate.

The polymer binder (B) is a non-silicon polyacrylate polymer, or a non-silicon polymer with a repeating unit containing an alcoholic hydroxyl, preferably a non-silicon polymer with a repeating unit containing an alcoholic hydroxyl, such as polyvinyl alcohol, or polyallyl alcohol.

<<Polysiloxane>>

The polysiloxane is a siloxane with a molecular repeating unit containing an alcoholic hydroxyl provided by the present invention. The silicon oxide formed by the contained silicon atom after oxygenolysis of the polymer can have a good blocking effect to prevent pollution to coating surface of the slurry by other elements, and can also reduce outward diffusion of the dopant component contained in the material according to the present invention, thereby reducing pollution to the outside, and enhancing the doping property in combination with the dopant component. Furthermore, the alcoholic hydroxyl contained therein can also assist the polymer binder (B) to enable the dopant component to be more uniformly distributed, while improving the solubility of the polysiloxane in a water-soluble doped slurry and mask material, so as to adjust addition amounts of the dopant component and the polysiloxane in a larger range according to actual requirements without affecting distribution uniformity and stability of the dopant component.

<<Solvent (C)>>

The solvent (C) may be a single organic solvent without addition of water, a mixed solvent of organic solvents, or a mixed solvent of an organic solvent and water. If the solvent is a single solvent, it is preferably an organic solvent having a boiling point of higher than 100° C., so as to prevent affecting the coating quality by very fast evaporation of the solvent. If the solvent is a mixed solvent, an organic solvent having a boiling point of lower than 100° C. may be selected. If an organic solvent having a boiling point of lower than 100° C. is used, it also must contain a mixed solvent of an organic solvent and water having a boiling point of higher than 100° C. and reaching 40 mass % or more relative to a total mass of the solvent. In order to prevent affecting the performance by very fast solvent volatilization in the coating process, a solvent having a boiling point of higher than 100° C. is also preferred even in a mixed solvent.

As the organic solvent contained in the solvent (C), 1-methoxy-2-propanol, diacetone alcohol, 2-propanol, n-butanol, 3-methoxy-3-methyl butanol, diethylene glycol methyl ethyl ether, propylene glycol, diethylene glycol monobutyl ether, dipropylene glycol monomethyl ether, alpha-terpineol, diethylene glycol monomethyl ether, diethylene glycol, methanol, ethanol, 1,4-dioxane, acetone, butanone, methyl lactate, ethyl lactate, and the like can be enumerated.

<<Method for Manufacturing a Semiconductor Unit of a Semiconductor Substrate>>

The method for manufacturing a semiconductor unit according to the present invention may be a method for manufacturing a semiconductor unit using a plurality of semiconductor substrates as follows, including following steps a to c, step a: coating a first conductive type impurity diffusion composition on one side of each semiconductor substrate, to form a first conductive type impurity diffusion composition film, step b: heating the semiconductor substrate on which the first conductive type impurity diffusion composition film is formed, to enable the first conductive type impurity to diffuse into the semiconductor substrate, so as to form a first conductive type impurity diffusion layer, and step c: heating the semiconductor substrate in an atmosphere of a gas containing a second conductive type impurity, to enable the second conductive type impurity to diffuse into the semiconductor substrate, so as to form a second conductive type impurity diffusion layer.

In the step b and the step c, respective sides on which the first conductive type impurity diffusion composition films of the semiconductor substrates with two pieces in each group are formed are oppositely placed.

(Step a)

As shown in FIG. 3i, a first conductive type impurity diffusion composition is coated on one side of a semiconductor substrate 1, to form a first conductive type impurity diffusion composition film 2.

The method for coating the first conductive type impurity diffusion composition is not specifically limited, and all well-known coating methods applicable to semiconductor substrates may be used. For example, a printing method, such as screen printing, or gravure printing, a spin coating method, scrubbing brush coating, a spraying method, a scraper coating method, a roll coating method, an inkjet printing method, or the like may be used.

As shown in FIG. 3i, although the case of coating the first conductive type impurity diffusion composition on whole surface of one side of the semiconductor substrate 1 is described, coating the first conductive type impurity diffusion composition on a part of the whole surface is also feasible.

A process of drying at least a part of the solvent in the first conductive type impurity diffusion composition film 2 may be further applied after forming the first conductive type impurity diffusion composition film 2 on one side of the semiconductor substrate 1. In the drying process, at least a part of the solvent is volatilized by, e.g., heating to 100° C. to 300° C.

As the semiconductor substrate 1, it is not specifically limited. For example, an n-type monocrystalline silicon at an impurity concentration of $10^{15}$ to $10^{16}$ atoms/cm$^3$, a polycrystalline silicon, and a crystalline silicon substrate mixed with other elements, such as germanium or carbon, can be enumerated. Furthermore, a p-type crystalline silicon or a non-silicon semiconductor may also be used.

The semiconductor substrate 1 has a thickness of 50 to 300 μm, and its shape is preferably a square having one side of 100 to 250 mm. Moreover, in order to remove slice damage and natural oxidation films, it is preferably subject to surface etching treatment using a hydrofluoric acid solution and an alkali solution.

Furthermore, two sides of the semiconductor substrate are etched using an alkali solution, and a fine relief structure referred to as a textured structure is preferably formed on the two sides. The textured structure is formed by, e.g., immersing the silicon substrate in a solution containing potassium hydroxide and isopropanol at 80° C.

The first conductive type impurity diffusion composition is not specifically limited, and is preferably a doped slurry and a mask material provided by the present invention.
(Step b)

As shown in FIG. 3ii, a semiconductor substrate 3 with the first conductive type impurity diffusion composition film 2 formed on one side thereof may be arranged to have two pieces in each group, and respective sides on which the first conductive type impurity diffusion composition films 2 are formed are oppositely arranged in a diffusion boat 4.

The diffusion boat 4 is provided with a groove to arrange a semiconductor substrate. The groove size and spacing of the diffusion boats are not specifically limited. The diffusion boat may also be inclined relative to the horizontal direction. The material of the diffusion boat is not specifically limited except that it can withstand the diffusion temperature, however, it is preferably quartz.

As shown in FIG. 3iii, the diffusion boat 4 provided with the semiconductor substrate 3 is heated in a diffusion furnace 16, to enable the first conductive type impurity to diffuse into the semiconductor substrate 1, to form a first conductive type impurity diffusion layer 5.

In this case, since the semiconductor substrate with two pieces in each group is provided as mentioned above, even if impurities diffuse from the impurity diffusion composition film 2 into a gas, the impurities are still very difficult to reach a side opposite to the side of the semiconductor substrate on which the first conductive type impurity diffusion composition film 2 is formed.

The thermal processing temperature and time when forming the first conductive type impurity diffusion layer 5 may be appropriately set based on an available desired diffusivity, such as the impurity diffusion concentration, or diffusion depth. For example, thermal diffusion may be set at a temperature of 800° C. or more, and 1200° C. or less for 1 to 120 min.

The gas atmosphere thermally processed to form the first conductive type impurity diffusion layer 5 is not specifically limited, but is preferably a mixed atmosphere of nitrogen, oxygen, argon, helium, xenon, neon, krypton, or the like, further preferably a mixed atmosphere of nitrogen and oxygen, and specifically preferably a mixed atmosphere of nitrogen and oxygen having an oxygen content of 5% or less by volume. In order to inhibit outward diffusion, the first conductive type impurity diffusion is preferably carried out in an oxygen-containing mixed atmosphere.

A distance W1 between sides on which the first conductive type impurity diffusion composition films 2 of the semiconductor substrates with two pieces in each group are formed, is not specifically limited, but is preferably 5 mm or less, and most preferably 1 mm or less.

Figure 4:
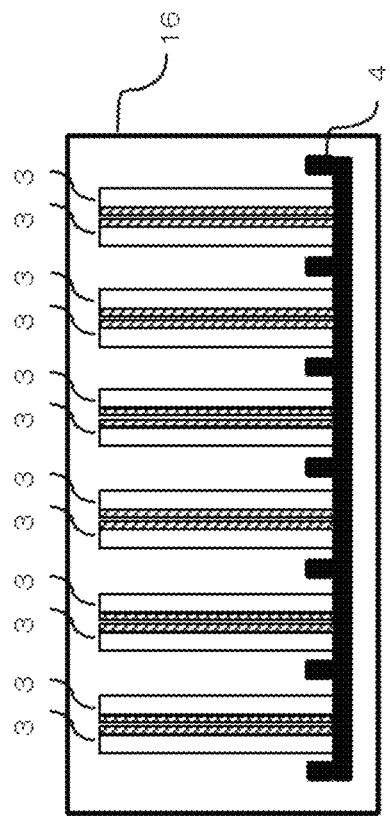
FIG. 4 is a schematic sectional view of an example of settings of a semiconductor substrate when forming a first conductive type impurity diffusion layer.
Figure 5I:
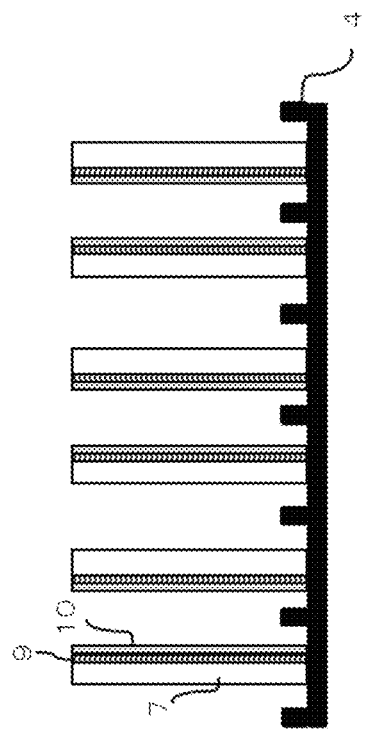
FIGS. 5*i* to 5*vii* including FIGS. 5*i*, 5*ii*, 5*iii*, 5*iv*, 5*v*, 5*vi*, and 5*vii*, are sectional views of a schematic process of an example of a method for manufacturing a solar cell according to the present invention.
Figure 5I:
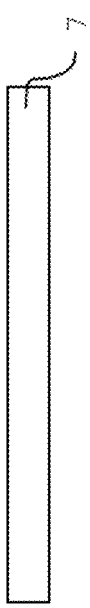
Figure 5I:
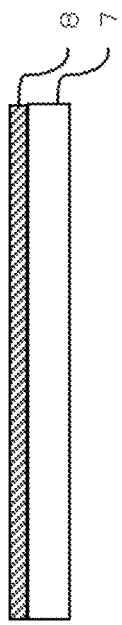
Figure 5V:
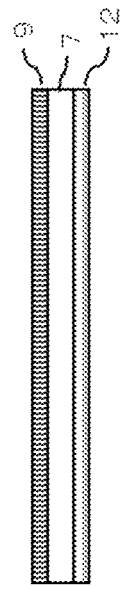
Figure 5I:
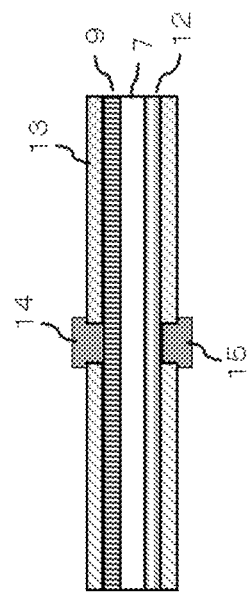
Figure 5I:
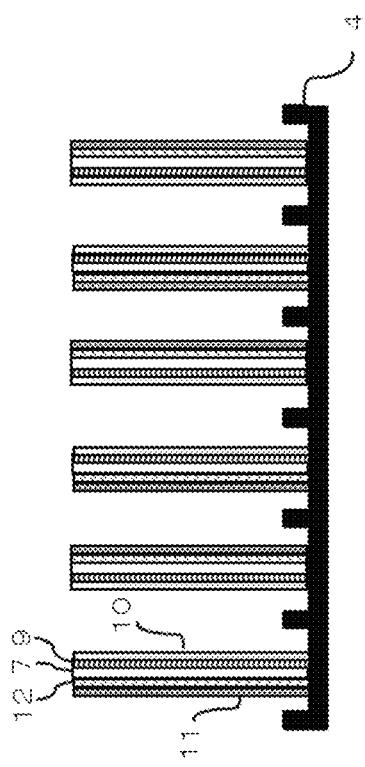
Figure 5V:
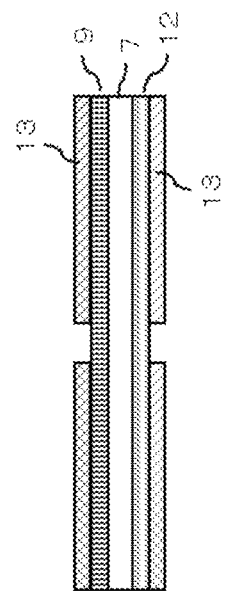

For example, as shown in FIG. 4, the semiconductor substrates with two pieces in each group may be provided in a groove of the diffusion boat 4. In order to inhibit the tendency of outward diffusion, the distance W1 between the sides on which the first conductive type impurity diffusion composition films 2 of the semiconductor substrates with two pieces in each group are formed is preferably a short distance. The distance W1 between the sides on which the first conductive type impurity diffusion composition films 2 are formed is further preferably 0 mm, i.e., the spacing is essentially 0 mm (in essence, the sides contact with each other).

A distance W2 between sides opposite to the sides on which the first conductive type impurity diffusion composition films of the semiconductor substrates in adjacent two groups are formed, is not specifically limited, but is preferably 1 to 5 mm, and further preferably 1 to 3 mm.

Preferably, for a plurality of groups of the semiconductor substrates with two pieces in each group, a distance between sides on which the first conductive type impurity diffusion composition films in each group are formed is W1, a distance between sides opposite to the sides on which the first conductive type impurity diffusion composition films in adjacent two groups are formed is W2, and W1 and W2 satisfy W1<W2. As mentioned above, when the step c is carried out in succession to the step b, arrangement of the semiconductor substrate on the diffusion boat remains unchanged, and impurities may diffuse into the other side of the semiconductor substrate.

Moreover, preferably, prior to the step b, for example, the semiconductor substrate 3 with the first conductive type impurity diffusion composition film formed on one side is thermally processed in an oxygen-containing gas atmosphere at a temperature of lower than the thermal processing temperature during diffusion, to remove at least a part of organic components such as a binder resin, from the first conductive type impurity diffusion composition film 2. When at least a part of the organic components such as the binder resin, is removed from the first conductive type impurity diffusion composition film 2, the concentrations of impurity components in the first conductive type impurity diffusion composition film on the semiconductor substrate can be improved, and diffusivity of the first conductive type impurity can be easily improved.

The gas atmosphere in the step b is not specifically limited, but is preferably a mixed atmosphere of nitrogen, oxygen, argon, helium, xenon, neon, krypton, or the like, and further preferably an oxygen-containing mixed atmosphere. The step b is preferably carried out in an oxygen-containing atmosphere, so that thermal decomposition of the organic components, such as a binder, in the first conductive type impurity diffusion composition film will be easier.

The oxygen content in the gas atmosphere is not specifically limited, but the volume content is preferably 20% or less, and further preferably 5% or less.
(Step c)

The semiconductor substrate provided on the diffusion boat in the step c is identical to the description of the step b. That is, the respective sides on which the first conductive type impurity diffusion composition films of the semiconductor substrates with two pieces in each group are formed are oppositely arranged.

The distance W1, between the sides on which the first conductive type impurity diffusion composition films 2 of the semiconductor substrates with two pieces in each group are formed, is not specifically limited, but is preferably 5 mm or less, and further preferably 1 mm or less.

For example, as shown in FIG. 4, the semiconductor substrates with two pieces in each group may be provided in a groove of the diffusion boat 4. In order to inhibit the tendency of outward diffusion, the distance W1, between the sides on which the first conductive type impurity diffusion composition films 2 of the semiconductor substrates with two pieces in each group are formed, is preferably a short distance. The distance W1 between the sides on which the first conductive type impurity diffusion composition films 2 are formed is further preferably 0 mm, i.e., the spacing is essentially 0 mm (in essence, the sides contact with each other).

The distance W2, between sides opposite to the sides on which the first conductive type impurity diffusion composition films of the semiconductor substrates in adjacent two groups are formed, is not specifically limited, but is preferably 1 to 5 mm, and further preferably 1 to 3 mm.

Preferably, for a plurality of groups of the semiconductor substrates with two pieces in each group, the distance between the sides on which the first conductive type impurity diffusion composition films in each group are formed is W1, the distance between sides opposite to the sides on which the first conductive type impurity diffusion composition films in adjacent two groups are formed is W2, and W1 and W2 satisfy W1<W2. As mentioned above, when the step c is carried out in succession to the step b, arrangement of the semiconductor substrate on the diffusion boat remains unchanged, and the second conductive type impurity may diffuse into the other side of the semiconductor substrate.

In the step c, the semiconductor substrate is heated while introducing a gas containing the second conductive type impurity, to form the second conductive type impurity diffusion layer, If the gas containing the second conductive type impurity is an n-type, it may be $POCl_3$ gas, and if it is a p-type, $BBr_3$, $BCl_3$, and other gas can be enumerated. The $POCl_3$ gas can be obtained by, e.g., insufflating nitrogen or a mixed gas of nitrogen/oxygen into $POCl_3$ solution, or heating the $POCl_3$ solution.

The heating temperature is preferably 750° C. to 1050° C., and further preferably 800° C. to 1000° C.

The gas atmosphere is not specifically limited, but is preferably a mixed atmosphere of nitrogen, oxygen, argon, helium, xenon, neon, krypton, or the like, further preferably a mixed atmosphere of nitrogen and oxygen, and specifically preferably a mixed atmosphere of nitrogen and oxygen having an oxygen content of 5% or less by volume.

Moreover, because the process time of switching the gas atmosphere can be shortened, the step c is preferably carried out without changing the atmosphere in the step b. In particular, a ratio of nitrogen to oxygen in the gas atmosphere in the step b is identical to a ratio of nitrogen to oxygen in the gas atmosphere in the step c. The preferred ratio in this case is: oxygen:nitrogen=1:99 to 5:95 by volume.

As shown in FIG. 3iii, after the step b, a thermal processing product layer 6 of the first conductive type impurity diffusion composition film is residual on the first conductive type impurity diffusion layer 5. The step c is carried out preferably using this layer as a mask for the gas containing the second conductive type impurity. In this way, the second conductive type impurity can be inhibited from mixing into the first conductive type impurity diffusion layer 5.

Whichever of the step b and the step c can be carried out first, or the step c and the step b can be carried out simultaneously. The step c is preferably carried out after the step b, if the thermal processing product layer of the first conductive type impurity diffusion composition film is used as a mask.

Moreover, the step c is preferably carried out after the step b and in succession to the step b. For example, after the step b, the step c is preferably directly carried out without taking out the diffusion boat from the firing furnace. If the step c is carried out after the step b and in succession to the step b, then it is referred to as performing the step c after the step b and in succession to the step b.

The heating temperature when forming the second conductive type impurity diffusion layer in the step c is preferably 50 to 200° C. lower than the heating temperature when forming the first conductive type impurity diffusion layer in the step b. By enabling the heating temperature when forming the second conductive type impurity diffusion layer in the step c to be 50 to 200° C. lower than the heating temperature when forming the first conductive type impurity diffusion layer in the step b, when the step c is carried out after the step b and in succession to the step b, the effect on heating the first conductive type impurity diffusion layer formed in the step b can be minimized, and diffusion of the first conductive type impurity can be easily controlled.

In the step c, compared with the diffusion using a gas containing a p-type impurity, the heating temperature of diffusion using a gas containing an n-type impurity can be implemented at a low temperature. Therefore, preferably, the first conductive type is a p type, and the second conductive type is an n-type.

Moreover, the method for manufacturing a semiconductor unit according to the present invention preferably includes following step d.

d. a step of oxidizing surface of the semiconductor substrate in an oxygen-containing atmosphere.

(Step d)

The time of carrying out the step d is not specifically limited. The step d can be preferably carried out after the step b or after the step c. The step d is preferably carried out after the step c and in succession to the step c. In this way, a diffusion layer (pollution layer) resulted from outward diffusion at a position without the need for diffusion can be removed. If the step d is carried out after the step c and in succession to the step c, then it is referred to as performing the step d after the step c and in succession to the step c.

The atmosphere is not specifically limited as long as it contains oxygen. A mixed atmosphere of nitrogen, argon, helium, xenon, neon, or krypton, and oxygen may be used. The atmosphere is preferably a mixed atmosphere of nitrogen and oxygen, further preferably a mixed atmosphere of nitrogen and oxygen having an oxygen content of 20% or more by volume, and specifically preferably an atmosphere of pure oxygen. The more the oxygen content is, the more the oxidation rate can be improved.

After these steps, the semiconductor unit can be manufactured using a known method. These methods are not specifically limited. For example, the following method can be enumerated as an example.

An anti-reflecting layer or passivation layer is formed on two sides of the semiconductor substrate. A variety of known materials can be used in these layers. These layers may be monolayered, or multi-layered. For example, the layer may be formed by stacking a silicon oxide layer, an aluminum oxide layer, a $SiN_x$ layer, and an amorphous silicon layer. These layers can be formed by an evaporation method, such as plasma CVD or ALD (atomic layer deposition), or a coating method.

Furthermore, it is possible to form a layer that has functions of an anti-reflecting layer and a passivation layer. As such a layer, a nitride layer formed by the plasma CVD can be enumerated.

A surface protection layer containing silicon oxide, aluminium oxide, or the like may also be present between the anti-reflecting layer and the semiconductor substrate. Moreover, it is also possible even if components of the anti-reflecting layer are partially changed.

It is also feasible to form the anti-reflecting layer on whole surface or a part of field of a light receiving surface and an inner surface. It is also feasible to arrange a contact hole on the upper surface of the impurity diffusion layer above the anti-reflecting layer. In this way, the electrodes and impurity diffusion layers formed thereafter can form electrical contact. The method of forming the contact hole is not limited, but is preferably etching. In etching, an appropriate material may be used as the material for the anti-reflecting layer. For example, ammonium fluoride, and the like can be enumerated.

In an appropriate scenario, a burn-through method may also be used. The burn-through method is a method of melting glass particles using a firing process after forming an electrode on an anti-reflecting layer, and binding the electrode to a semiconductor substrate while decomposing the anti-reflecting layer, and is known as burn-through, i.e., burn-through method. In this case, a material suitable for the anti-reflecting layer is silicon nitride.

Then, an electrode is formed on two sides of the semiconductor substrate. A method commonly used in electrode formation may be used without special limitations.

When the burn-through method is used, for example, a metal slurry for a surface electrode containing metal particles and glass particles may be used. The metal slurry for a surface electrode can be applied to enable it to form a desired pattern in the field of forming the impurity diffusion layer. The metal particles are enabled to run through the anti-reflecting layer or passivation layer by thermal processing, so as to form the surface electrode in the electrode formation field on the impurity diffusion layer. As the metal slurry for a surface electrode, for example, a silver paste or the like commonly used in the technical field may be used.

FIG. 5 will show process diagrams of an example of a method for manufacturing a solar cell unit receiving light on both sides involved in the embodiment as sectional views by models. However, the present invention is not limited to the process diagrams in any way.

An example of the semiconductor substrate being an n-type semiconductor substrate, the first conductive type being a p-type, and the second conductive type being an n-type is described by referring to FIG. 5.

First, as shown in FIG. 5$i$, an n-type semiconductor substrate 7 having a thickness of about 50 to 300 μm is prepared. The n-type semiconductor substrate 7 is obtained by slicing a monocrystalline or multicrystalline silicon ingot formed by CZ (Czochrzlski) method, FZ (Floating Zone) method, EFG (Edge Defined Film Growth) method, casting method, or the like, e.g., having an n-type impurity (phosphorus, or the like) at a concentration of $1*10^{15}$ atoms/cm$^3$ to $1*10^{19}$ atoms/cm$^3$.

The n-type semiconductor substrate 7 is preferably washed with a water solution of alkali. By washing with a water solution of alkali, organic substances, particles and the like present on the surface of the n-type semiconductor substrate 7 can be removed, and the passivation effect can be improved.

As a method of washing with a water solution of alkali, a general well-known RCA cleaning method can be illustrated. For example, the organic substances and the particles can be removed by immersing the n-type semiconductor substrate 7 in a mixed solution of ammonia water-hydrogen peroxide, and processing at 60° C. to 80° C. The washing duration is preferably 10 sec to 10 min, and further preferably 30 sec to 5 min.

For the n-type semiconductor substrate 7, a textured structure of, e.g., a pyramid structure, is preferably formed on both sides by alkaline etching or the like (not shown in the figure). Thus, the reflection of sunlight can be inhibited.

Then, as shown in FIG. 5$ii$, a p-type impurity diffusion composition is coated on one side to form a p-type impurity diffusion composition film 8. Then, as shown in FIG. 5$iii$, the semiconductor substrate 7 is provided in the diffusion boat 4 with respective sides on which the impurity diffusion composition films are formed opposite to each other.

Then, a p-type diffusion layer 9 is formed by thermal diffusion. In this case, the p-type impurity diffusion composition film 8 forms a thermal processing product 10 by thermal processing intended for thermal diffusion. The thermal processing temperature is preferably 800° C. to 1200° C.

Then, as shown in FIG. 5$iv$, while bubbling by introducing nitrogen or a mixed atmosphere of nitrogen and oxygen into POCl$_3$ solution, the n-type semiconductor substrate 7 is heated to 750° C. to 950° C., to form both a phosphosilicate glass layer 11 and an n-type impurity diffusion layer 12. As a mask layer, the thermal processing product 10 of the p-type impurity diffusion composition film can inhibit diffusion of phosphorus into the inner surface formed by the p-type impurity diffusion layer 9. Then, the semiconductor substrate is oxidized in an oxygen-containing atmosphere, to enable the phosphorus pollution layer to be oxidized. The thermal processing product 10 of the p-type impurity diffusion composition film of the oxidized pollution layer and the phosphosilicate glass layer 11 are integrated (not shown in the figure).

Then, as shown in FIG. 5$v$, the thermal processing product 10 of the p-type impurity diffusion composition film and the phosphosilicate glass layer 11 are removed. As a removing method, for example, immersion in an etching solution, such as hydrofluoric acid, can be enumerated.

Then, as shown in FIG. 5$vi$, an anti-reflecting layer and passivation layer 13 is formed respectively on a light receiving surface and an inner surface. The anti-reflecting layer and passivation layer 13 is described hereinbefore, and preferred examples, such as a silicon nitride layer, a titanium oxide layer, a silicon oxide layer, or an aluminum oxide layer, can be enumerated.

In the embodiment, the anti-reflecting layer and passivation layer 13 is formed in a part of field of the light receiving surface and the inner surface.

Then, as shown in FIG. 5$vii$, a p-electrode 14 and an n-electrode 15 are formed on a part of respective upper surface of the light receiving surface and the inner surface without the anti-reflecting layer and passivation layer 13. The electrodes may be formed by thermal processing after providing a slurry capable of forming an electrode.

In FIGS. 5$i$ to 5$vii$, a method for presetting a missing site and a method for forming the p-electrode 14 and the an-electrode 15 on the anti-reflecting layer and passivation layer 13 of the n-type semiconductor substrate are illustrated. However, when the anti-reflecting layer and passivation layer 13 is formed on the whole surface, a slurry containing burn-through glass particles is used as the slurry for forming an electrode, and runs through the anti-reflecting layer and passivation layer 13 after firing, thus ohmic contact between the impurity diffusion layer and the electrode may be achieved. The solar cell unit can be obtained by the above operations.

<<Synthesis of Polysiloxane>>

Preparation Example 1

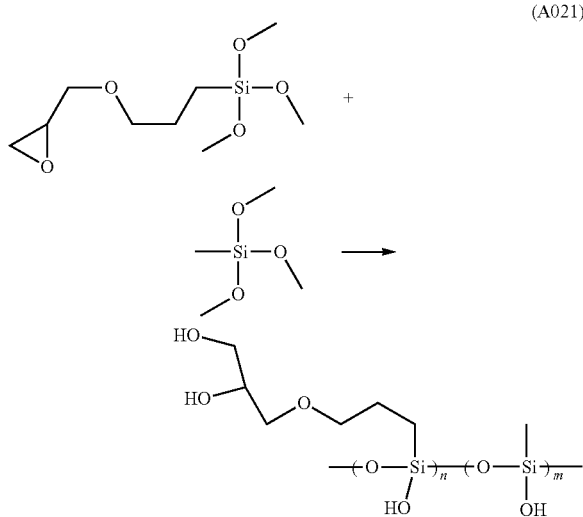

At room temperature, 104.98 g of 3-glycidyloxypropyltrimethoxysilane, 1.23 g of methyltrimethoxysilane, and 130.47 g of diethylene glycol monomethyl ether were successively added to a reactor of an appropriate size. After heating to 40° C., a mixed solution of concentrated sulfuric acid (0.23 g) and water (40.47 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane A021 provided by the present invention.

Preparation Example 2

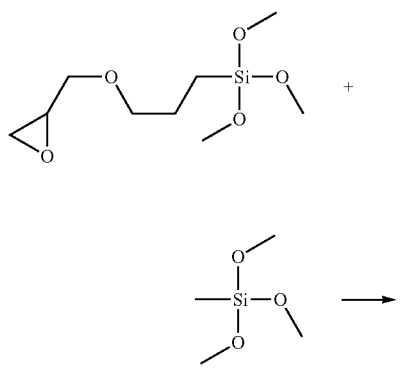

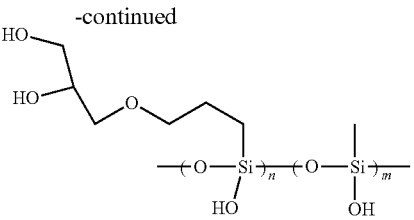

At room temperature, 41.21 g of 3-glycidyloxypropyltrimethoxysilane, 95.02 g of methyltrimethoxysilane, and 130.47 g of diethylene glycol monomethyl ether were successively added to a reactor of an appropriate size. After heating to 40° C., a mixed solution of concentrated sulfuric acid (0.44 g) and water (78.47 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane A021 provided by the present invention.

Preparation Example 3

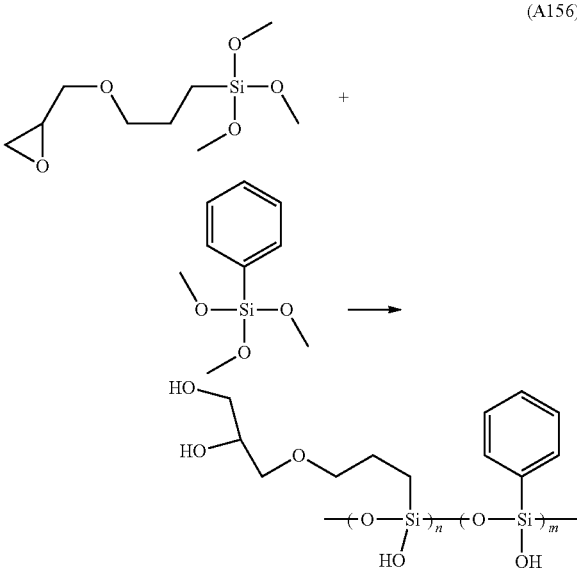

At room temperature, 98.07 g of 3-glycidyloxypropyltrimethoxysilane, 9.14 g of phenyltrimethoxysilane, and 130.47 g of diethylene glycol monomethyl ether were successively added to a reactor of an appropriate size. After heating to 40° C., a mixed solution of concentrated sulfuric acid (0.23 g) and water (41.49 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane A156 provided by the present invention.

Preparation Example 4

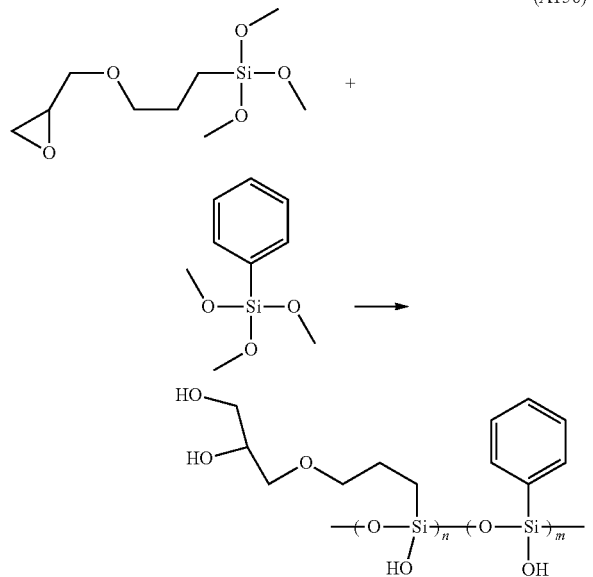

(A156)

At room temperature, 61.83 g of 3-glycidyloxypropyltrimethoxysilane, 51.88 g of phenyltrimethoxysilane, and 130.47 g of diethylene glycol monomethyl ether were successively added to a reactor of an appropriate size. After heating to 40° C., a mixed solution of concentrated sulfuric acid (0.26 g) and water (47.09 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane A156 provided by the present invention.

Preparation Example 5

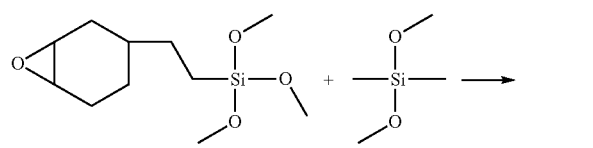

(A081)

-continued

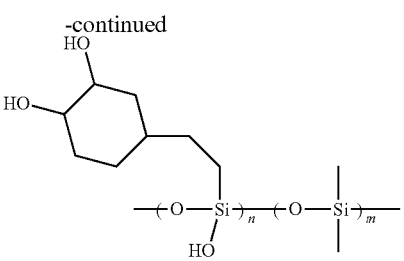

At room temperature, 102.93 g of 2-(3,4-epoxycyclohexyl)ethyltrimethoxysilane, 2.64 g of dimethyldimethoxysilane, and 130.47 g of diethylene glycol monomethyl ether were successively added to a reactor of an appropriate size. After heating to 40° C., a mixed solution of concentrated sulfuric acid (0.22 g) and water (39.58 g) was added dropwise. On completion of the dropsise addition, the resulting solution was further stirred at 40° C. for another 1 h. Then, the solution was heated to 70° C., and stirred for 1 h and 30 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4000±200. After cooling to 40° C. or less, the resulting solution was transferred to other container, and kept at −20° C. to 40° C., to obtain the polysiloxane A081 provided by the present invention.

Preparation Example 6

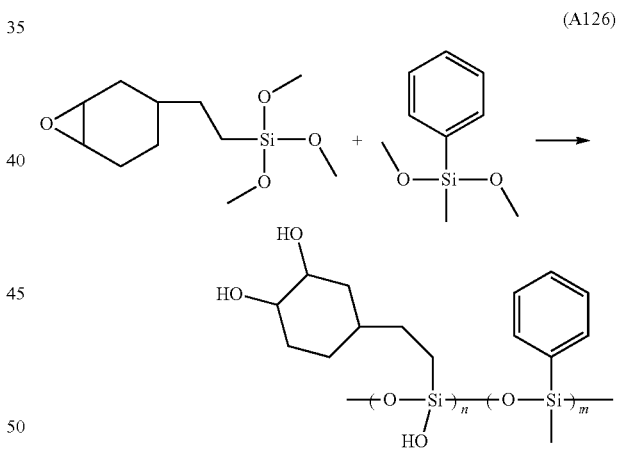

(A126)

At room temperature, 89.91 g of 2-(3,4-epoxycyclohexyl)ethyltrimethoxysilane, 16.63 g of methylphenyldimethoxysilane, and 130.47 g of diethylene glycol monomethyl ether were successively added to a reactor of an appropriate size. After heating to 40° C., a mixed solution of concentrated sulfuric acid (0.23 g) and water (41.05 g) was added dropwise. On completion of the dropsise addition, the resulting solution was further stirred at 40° C. for another 1 h. Then, the solution was heated to 70° C., and stirred for 1 h and 30 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 1000±200. After cooling to 40° C. or less, the resulting solution was transferred to other container, and kept at −20° C. to 40° C., to obtain the polysiloxane A126 provided by the present invention.

Preparation Example 7

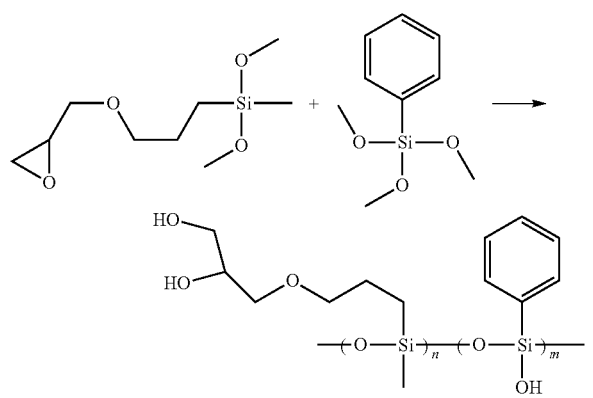
(A159)

At room temperature, 67.38 g of 3-glycidyloxypropyltrimethoxysilane, 40.43 g of phenyltrimethoxysilane, and 130.47 g of diethylene glycol monomethyl ether were successively added to a reactor of an appropriate size. After heating to 40° C., a mixed solution of concentrated sulfuric acid (0.26 g) and water (45.87 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 10800±200 g/mol. After cooling to 40° C. or less, the resulting solution was transferred to other container, and kept at −20° C. to 40° C., to obtain the polysiloxane A159 provided by the present invention.

Preparation Example 8

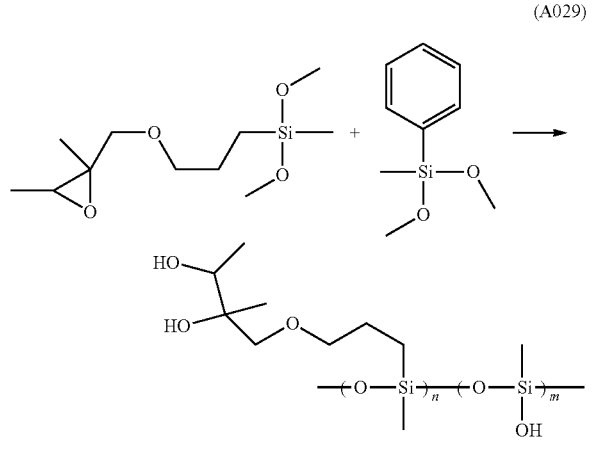
(A029)

At room temperature, 85.40 g of 3-glycidyloxypropyltrimethoxysilane, 20.7 g of methyltrimethoxysilane, and 130.47 g of diethylene glycol monomethyl ether were successively added to a reactor of an appropriate size. After heating to 40° C., a mixed solution of concentrated sulfuric acid (0.25 g) and water (44.21 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 3000±200 g/mol. After cooling to 40° C. or less, the resulting solution was transferred to other container, and kept at −20° C. to 40° C., to obtain the polysiloxane A029 provided by the present invention.

Preparation Example 9

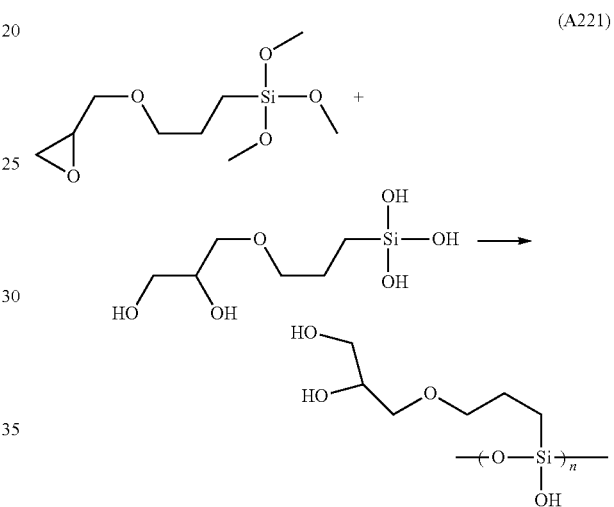
(A221)

At room temperature, 112.47 g of 3-glycidyloxypropyltrimethoxysilane, and 130.47 g of diethylene glycol monomethyl ether were successively added to a reactor of an appropriate size. After heating to 40° C., a mixed solution of concentrated sulfuric acid (0.24 g) and water (42.83 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 6800±200 g/mol. After cooling to 40° C. or less, the resulting solution was transferred to other container, and kept at −20° C. to 40° C., to obtain the polysiloxane A221 provided by the present invention.

Preparation Example 10

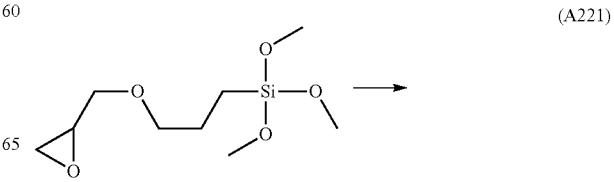
(A221)

-continued

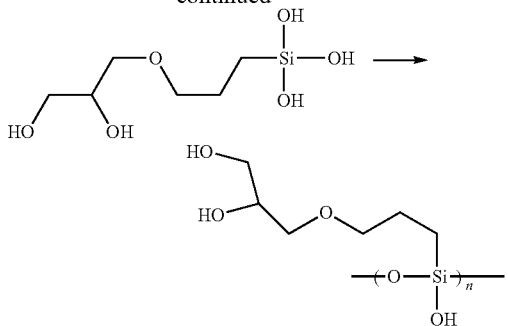

At room temperature, 112.47 g of 3-glycidyloxypropylt-rimethoxysilane, and 130.47 g of diethylene glycol monomethyl ether were successively added to a reactor of an appropriate size. After heating to 40° C., a mixed solution of concentrated sulfuric acid (0.24 g) and water (42.83 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane (A221) provided by the present invention.

Preparation Example 11

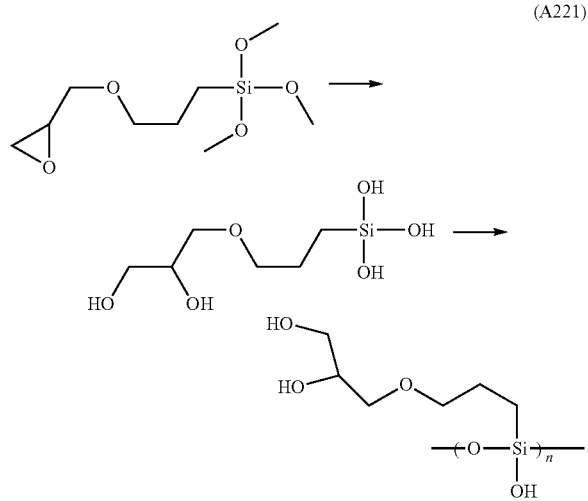

At room temperature, 112.47 g of 3-glycidyloxypropylt-rimethoxysilane, and 130.47 g of 3-methoxy-3-methylbutanol were successively added to a reactor of an appropriate size. After heating to 40° C., a mixed solution of concentrated sulfuric acid (0.24 g) and water (42.83 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane (A221) provided by the present invention.

Preparation Example 12

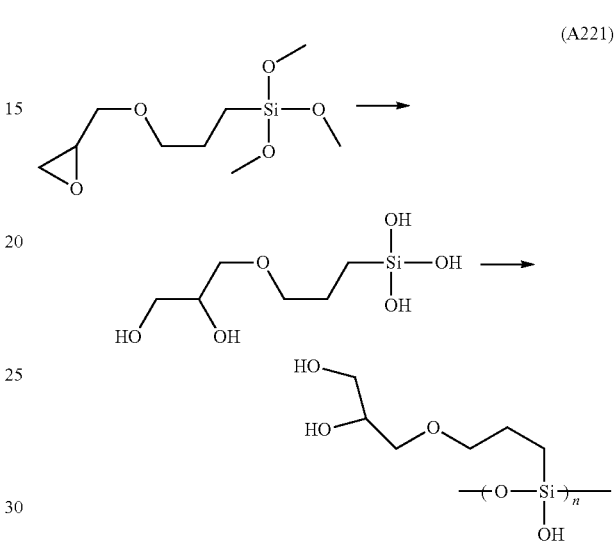

At room temperature, 112.47 g of 3-glycidyloxypropylt-rimethoxysilane, and 130.47 g of 3-methoxy-3-methylbutanol were successively added to a reactor of an appropriate size. After heating to 40° C., a mixed solution of concentrated sulfuric acid (0.24 g) and water (42.83 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 8600±200 g/mol. After cooling to 40° C. or less, the resulting solution was transferred to other container, and kept at −20° C. to 40° C., to obtain the polysiloxane (A221) provided by the present invention.

Preparation Example 13

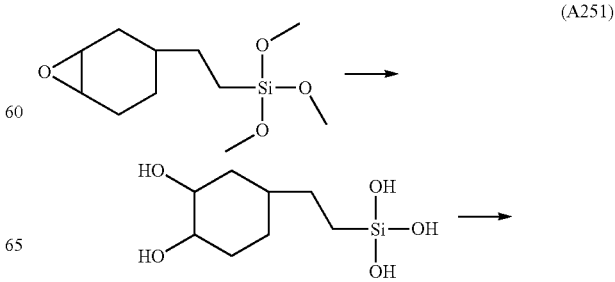

-continued

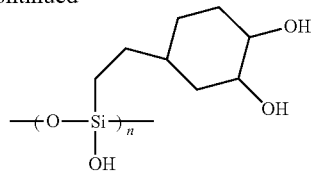

At room temperature, 112.47 g of 2-(3,4-epoxycyclohexyl)ethyltrimethoxysilane, and 130.47 g of 3-methoxy-3-methylbutanol were successively added to a reactor of an appropriate size. After heating to 40° C., a mixed solution of concentrated sulfuric acid (0.23 g) and water (41.08 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 9000±200. After cooling to 40° C. or less, the resulting solution was transferred to other container, and kept at −20° C. to 40° C., to obtain the polysiloxane (A251) provided by the present invention.

Preparation Example 14

(A211)

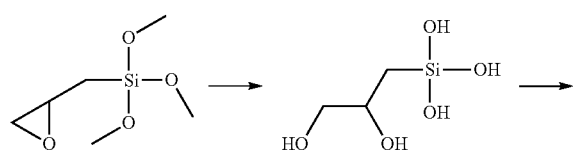

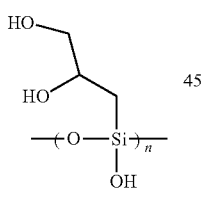

At room temperature, 112.47 g of 3-glycidyltrimethoxysiloxane, and 130.47 g of diethylene glycol monomethyl ether were successively added to a reactor of an appropriate size. After heating to 40° C., a mixed solution of concentrated sulfuric acid (0.32 g) and water (56.78 g) was added dropwise. On completion of the dropsise addition, the resulting solution was further stirred at 40° C. for another 1 h. Then, the solution was heated to 70° C., and stirred for 1 h and 30 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 1000±200. After cooling to 40° C. or less, the resulting solution was transferred to other container, and kept at −20° C. to 40° C., to obtain the polysiloxane (A211) provided by the present invention.

Preparation Example 15

(A222)

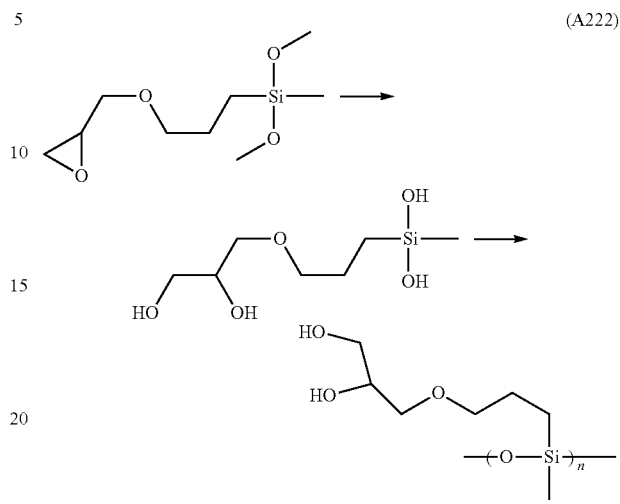

At room temperature, 112.47 g of methyl-3-glycidyloxypropyldimethoxysilane, and 130.47 g of 3-methoxy-3-methylbutanol were successively added to a reactor of an appropriate size. After heating to 40° C., a mixed solution of concentrated sulfuric acid (0.23 g) and water (41.65 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 10800±200 g/mol. After cooling to 40° C. or less, the resulting solution was transferred to other container, and kept at −20° C. to 40° C., to obtain the polysiloxane (A222) provided by the present invention.

Preparation Example 16

(A232)

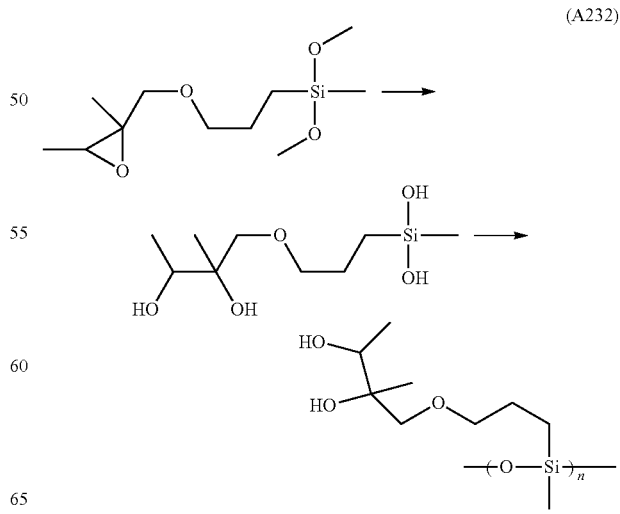

At room temperature, 112.47 g of methyl-3-glycidyloxypropyldimethoxysilane, and 130.47 g of 3-methoxy-3-methylbutanol were successively added to a reactor of an appropriate size. After heating to 40° C., a mixed solution of concentrated sulfuric acid (0.22 g) and water (40.83 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane (A232) provided by the present invention.

Preparation Example 17

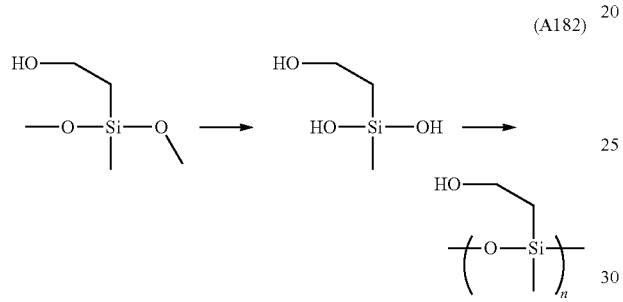

(A182)

At room temperature, 160 g of methyl-2-hydroxyethyldimethoxysilane, and 130 g of 3-methoxy-3-methylbutanol were successively added to a reactor of an appropriate size. After heating to 40° C., a mixed solution of p-toluenesulfonic acid (0.4 g) and water (60 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane (A182) provided by the present invention.

Preparation Example 18

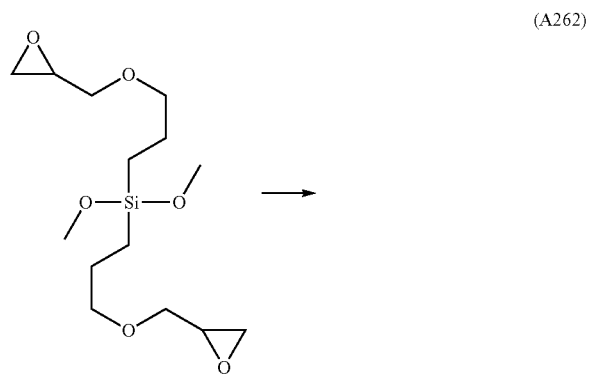

(A262)

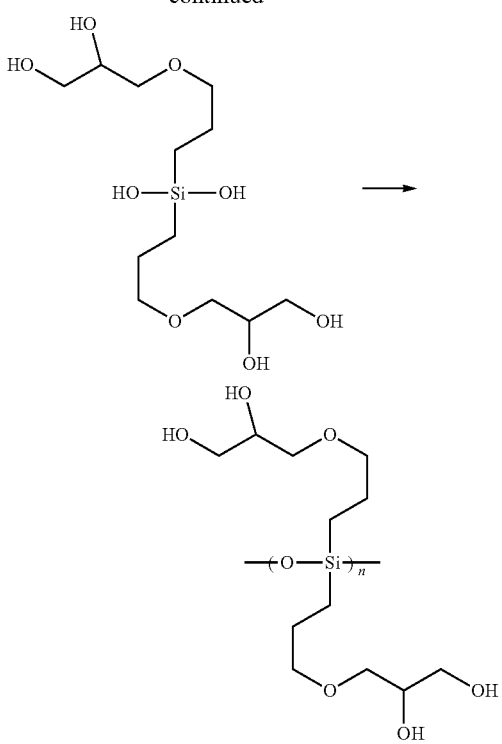

At room temperature, 120 g of bis(3-glycidyloxypropyl)dimethoxysilane, and 130.47 g of 3-methoxy-3-methylbutanol were successively added to a reactor of an appropriate size. After heating to 40° C., a mixed solution of concentrated sulfuric acid (0.32 g) and water (75 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane (A262) provided by the present invention.

Preparation Example 19

(A266)

-continued

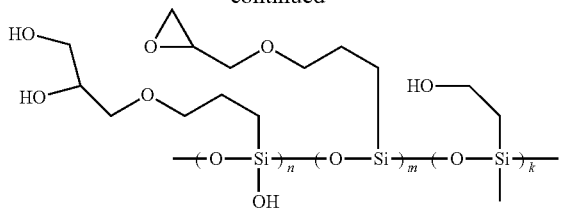

At room temperature, 70 g of 3-glycidyloxypropyltrimethoxysilane, 40 g of methyl-2-hydroxyethyl-dimethoxysilane, and 130.47 g of 3-methoxy-3-methylbutanol were successively added to a reactor of an appropriate size. After heating to 40° C., a mixed solution of p-toluenesulfonic acid (0.32 g) and water (60 g) was added dropwise. On completion of the dropsise addition, the resulting solution was further stirred at 40° C. for another 1 h. Then, the solution was heated to 70° C., and stirred for 1 h and 20 min. Then, the solution was heated to 100° C., and stirred for 1 h. Then, the oil bath was heated to 120° C., and stirred. After the oil bath was heated to 120° C., the reaction was detected by GPC, until reaching a target weight average molecular weight of 4500±200 g/mol. After cooling to 40° C. or less, the resulting solution was transferred to other container, and kept at −20° C. to 40° C., to obtain the polysiloxane (A266) provided by the present invention.

<<Preparation of a Material for Solar Energy and a Semiconductor>>

A material for solar energy and a semiconductor according to the present invention includes, but is not limited to, a doped slurry and a mask material.

Example 1

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 16.67 g of the polysiloxane synthesized in the Preparation Example 1 was added dropwise. After further stirring for another 1 h, the resulting solution was transferred to other container and kept at −20° C. to 40° C., to obtain a material for solar energy and a semiconductor provided by the present invention.

Example 2

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 16.67 g of the polysiloxane synthesized in the Preparation Example 1 was added dropwise. Then, 0.375 g of diboron trioxide was added. After further stirring for another 1 h, the resulting solution was transferred to other container and kept at −20° C. to 40° C., to obtain a material for solar energy and a semiconductor provided by the present invention.

Example 3

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 16.67 g of the polysiloxane synthesized in the Preparation Example 3 was added dropwise. Then, 0.75 g of diboron trioxide was added. After further stirring for another 1 h, the resulting solution was transferred to other container and kept at −20° C. to 40° C., to obtain a material for solar energy and a semiconductor provided by the present invention.

Example 4

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.26 g of 85 wt % water solution of phosphoric acid was added. Then, 16.67 g of the polysiloxane synthesized in the Preparation Example 3 was added dropwise, and further stirred at 80° C. for another 1 h. After cooling to 40° C. or less, the resulting solution was transferred to other container, and kept at −20° C. to 40° C., to obtain a material for solar energy and a semiconductor provided by the present invention.

Example 5

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 16.67 g of the polysiloxane synthesized in the Preparation Example 4 was added dropwise, and further stirred at 80° C. for another 1 h. After cooling to 40° C. or less, the resulting solution was transferred to other container, and kept at −20° C. to 40° C., to obtain a material for solar energy and a semiconductor provided by the present invention.

Example 6

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 25 g of the polysiloxane synthesized in the Preparation Example 4 was added dropwise. After further stirring for another 1 h, the resulting solution was transferred to other container and kept at −20° C. to 40° C., to obtain a material for solar energy and a semiconductor provided by the present invention.

Example 7

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 25 g of the polysiloxane synthesized in the Preparation Example 6 was added dropwise. Then, 0.375 g of diboron trioxide was added, and further stirred for another 1 h. After cooling to 40° C. or less, the resulting solution was transferred to other container and kept at −20° C. to 40° C., to obtain a material for solar energy and a semiconductor provided by the present invention.

Example 8

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 25 g of the polysiloxane synthesized in the Preparation Example 6 was added dropwise. Then, 0.625 g of diboron trioxide was added, and further stirred for another 1 h. After cooling to 40° C. or less, the resulting solution was transferred to other container and kept at −20° C. to 40° C., to obtain a material for solar energy and a semiconductor provided by the present invention.

Example 9

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 25 g of the polysiloxane synthesized in the Preparation Example 1 was added dropwise. Then, 0.625 g of diboron trioxide and 0.2 g of triethylene diamine were successively added, and further stirred for another 1 h. After cooling to 40° C. or less, the resulting solution was transferred to other container and kept at −20° C. to 40° C., to obtain a material for solar energy and a semiconductor provided by the present invention.

Example 10

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 16.67 g of the polysiloxane synthesized in the Preparation Example 10 was added dropwise. After further stirring for another 1 h, the resulting solution was transferred to other container and kept at −20° C. to 40° C., to obtain a material for solar energy and a semiconductor provided by the present invention.

Example 11

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 16.67 g of the polysiloxane synthesized in the Preparation Example 10 was added dropwise. Then, 0.375 g of diboron trioxide was added. After further stirring for another 1 h, the resulting solution was transferred to other container and kept at −20° C. to 40° C., to obtain a material for solar energy and a semiconductor provided by the present invention.

Example 12

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropwise addition, the resulting solution was further stirred at 80° C. until polyvinyl alcohol was fully dissolved. Then, 0.73 g of diboron trioxide was added, and further stirred at 80° C. for another 1 h. Then, 16.67 g of the polysiloxane synthesized in the Preparation Example 11 was added dropwise. Then, 0.75 g of diboron trioxide was added. After further stirring for another 1 h, the resulting solution was transferred to other container and kept at −20° C. to 40° C., to obtain a material for solar energy and a semiconductor provided by the present invention.

Example 13

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.26 g of 85 wt % water solution of phosphoric acid was added. Then, 16.67 g of the polysiloxane synthesized in the Preparation Example 11 was added dropwise, and further stirred at 80° C. for another 1 h. After cooling to 40° C. or less, the resulting solution was transferred to other container, and kept at −20° C. to 40° C., to obtain a material for solar energy and a semiconductor provided by the present invention.

Example 14

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 16.67 g of the polysiloxane synthesized in the Preparation Example 10 was added dropwise, and further stirred at 80° C. for another 1 h. After cooling to 40° C. or less, the resulting solution was transferred to other container, and kept at −20° C. to 40° C., to obtain a material for solar energy and a semiconductor provided by the present invention.

Example 15

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 25 g of the polysiloxane synthesized in the Preparation Example 10 was added dropwise. After further stirring for another 1 h, the resulting solution was transferred to other container and kept at −20° C. to 40° C., to obtain a material for solar energy and a semiconductor provided by the present invention.

Example 16

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 25 g of the polysiloxane synthesized in the Preparation Example 10 was added dropwise. Then, 0.375 g of diboron trioxide was added, and further stirred for another 1 h. After cooling to 40° C. or less, the resulting solution was transferred to other container and kept at −20° C. to 40° C., to obtain a material for solar energy and a semiconductor provided by the present invention.

Example 17

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 25 g of the polysiloxane synthesized in the Preparation Example 10 was added dropwise. Then, 0.625 g of diboron trioxide was added, and further stirred for another 1 h. After cooling to 40° C. or less, the resulting solution was transferred to other container and kept at −20° C. to 40° C., to obtain a material for solar energy and a semiconductor provided by the present invention.

Example 18

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 25 g of the polysiloxane synthesized in the Preparation Example 10 was added dropwise. Then, 0.625 g of diboron trioxide and 0.2 g of triethylene diamine were successively added, and further stirred for another 1 h. After cooling to 40° C. or less, the resulting solution was transferred to other container and kept at −20° C. to 40° C., to obtain a material for solar energy and a semiconductor provided by the present invention.

Example 19

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 20 g of the polysiloxane synthesized in the Preparation Example 10 was added dropwise. After further stirring for another 1 h, the resulting solution was transferred to other container and kept at −20° C. to 40° C., to obtain a material for solar energy and a semiconductor provided by the present invention.

Example 20

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 16 g of the polysiloxane synthesized in the Preparation Example 13 was added dropwise. After further stirring for another 1 h, the resulting solution was transferred to other container and kept at −20° C. to 40° C., to obtain a material for solar energy and a semiconductor provided by the present invention.

Example 21

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 9 g of the polysiloxane synthesized in the Preparation Example 14 was added dropwise. After further stirring for another 1 h, the resulting solution was transferred to other container and kept at −20° C. to 40° C., to obtain a material for solar energy and a semiconductor provided by the present invention.

Example 22

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 17 g of the polysiloxane synthesized in the Preparation Example 15 was added dropwise. After further stirring for another 1 h, the resulting solution was transferred to other container and kept at −20° C. to 40° C., to obtain a material for solar energy and a semiconductor provided by the present invention.

Example 23

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 16.4 g of the polysiloxane synthesized in the Preparation Example 16 was added dropwise. After further stirring for another 1 h, the resulting solution was transferred to other container and kept at −20° C. to 40° C., to obtain a material for solar energy and a semiconductor provided by the present invention.

Example 24

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 6 g of the polysiloxane synthesized in the Preparation Example 17 was added dropwise. After further stirring for another 1 h, the resulting solution was transferred to other container and kept at −20° C. to 40° C., to obtain a material for solar energy and a semiconductor provided by the present invention.

Example 25

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 19 g of the polysiloxane synthesized in the Preparation Example 18 was added dropwise. After further stirring for another 1 h, the resulting solution was transferred to other container and kept at −20° C. to 40° C., to obtain a material for solar energy and a semiconductor provided by the present invention.

Example 26

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then after cooling to 40° C. or less, 18.3 g of the polysiloxane synthesized in the Preparation Example 19 was added dropwise. After further stirring for another 1 h, the resulting solution was transferred to other container and kept at −20° C. to 40° C., to obtain a material for solar energy and a semiconductor provided by the present invention.

Comparison Example 1

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. After cooling to 40° C. or less, the resulting solution was transferred to other container and kept at −20° C. to 40° C., to obtain a doped slurry.

Comparison Example 2

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 16.67 g of a diethylene glycol monomethyl ether solution of 40 mass % polydimethylsiloxane having a weight average molecular weight of 4400 g/mol was added dropwise. The resulting solution was further stirred for additional 1 h. The solution was cooled to 40° C. or less, and an oily product precipitated. The obtained doped slurry was less uniform.

Comparison Example 3

At room temperature, 58.55 g of 3-methoxy-3-methylbutanol, and 4.22 g of polyvinyl alcohol were successively added to a reactor of an appropriate size. After heating to 80° C., 36.00 g of water was added dropwise. On completion of the dropsise addition, the resulting solution was further stirred at 80° C. until polyvinyl alcohol was fully dissolved. Then, 0.73 g of diboron trioxide was added, and further stirred at 80° C. for another 1 h. Then, 16.67 g of a diethylene glycol monomethyl ether solution of 40 mass % polyphenylsiloxane having a weight average molecular weight of 5000 g/mol was added dropwise. The resulting solution was further stirred for additional 1 h. The solution was cooled to 40° C. or less, and an oily product precipitated. The obtained doped slurry was less uniform.

<<Performance Evaluation of Doped Slurry and Mask Material>>

Figure 1:
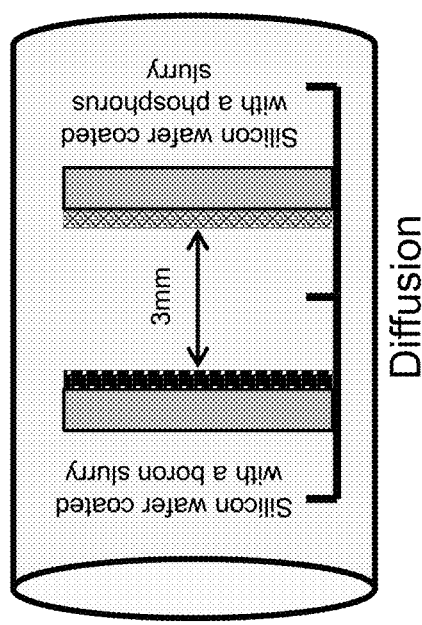
FIG. 1 is a silicon wafer placement mode in a barrier property evaluation test.

The doped slurry and mask material prepared in the Examples 1 to 26 and the Comparison Examples 1 to 3 were coated on 6-inch n-type monocrystalline silicon wafers respectively by spin coating, and then relevant performances were evaluated by thermal diffusion. The spin coating conditions were: (A) at a rotational speed of 1000 rpm for 10 sec, (B) at a rotational speed of 1500 rpm for 10 sec, and (C)

at a rotational speed of 2000 rpm for 10 sec. Silicon wafer A: One side of a semiconductor was polished, and phosphorus was doped into an n-type monocrystalline silicon wafer by Czochrzlski method, having a crystal orientation of 100, a resistivity of 0.5 to 6 Ω·cm, and a thickness of 625 μm. Silicon wafer B: Both sides of a solar cell were textured, and phosphorus was doped into an n-type monocrystalline silicon wafer by Czochrzlski method, having a crystal orientation of 100, a resistivity of 1 to 7Ω·cm, and a thickness of 180 μm. The silicon wafer placement mode during barrier property evaluation was as shown in FIG. 1, and the silicon wafer placement mode during evaluation on diffusivity in a gas was as shown in FIG. 2. Resistance tester: Sheet resistivity meter of Napson using four-point probe, manual version RT-70V/RG-7. The performance evaluation results were as follows:

TABLE 1

| No. | Silicon wafer | Doped slurry, mask material | Spin coating conditions | Polysiloxane | Film thickness (μm) | Diffusion conditions | Diffusivity Surface resistance (Ω/□) | Barrier property Surface resistance (Ω/□) | Diffusion in a gas Surface resistance (Ω/□) |
|---|---|---|---|---|---|---|---|---|---|
| 1 | A | Comparison Example 1 | (C) | — | 0.47 | 950° C., 30 min | 47 | 7 | 43 |
| 2 | A | Example 1 | (C) | A021 | 1.01 | 950° C., 30 min | 40 | 346 | 436 |
| 3 | A | Example 1 | (B) | A021 | 1.44 | 950° C., 30 min | 32 | 562 | 397 |
| 4 | A | Example 3 | (C) | A156 | 1.05 | 950° C., 30 min | 31 | 421 | 501 |
| 5 | A | Example 3 | (B) | A156 | 1.50 | 950° C., 30 min | 35 | 643 | 474 |
| 6 | A | Example 5 | (C) | A156 | 0.98 | 950° C., 30 min | 42 | 582 | 576 |
| 7 | A | Example 5 | (B) | A156 | 1.37 | 950° C., 30 min | 41 | 749 | 518 |
| 8 | A | Example 8 | (C) | A126 | 1.05 | 950° C., 30 min | 44 | 1125 | 867 |
| 9 | A | Example 8 | (B) | A126 | 1.47 | 950° C., 30 min | 45 | 679 | 793 |
| 10 | A | Example 9 | (C) | A021 | 1.07 | 950° C., 30 min | 41 | 463 | 507 |
| 11 | A | Example 9 | (B) | A021 | 1.54 | 950° C., 30 min | 41 | 683 | 478 |
| 12 | A | Example 10 | (C) | A221 | 1.09 | 950° C., 30 min | 36 | 126 | 521 |
| 13 | A | Example 10 | (B) | A221 | 1.47 | 950° C., 30 mm | 30 | 227 | 465 |
| 14 | A | Example 10 | (A) | A221 | 2.19 | 950° C., 30 min | 28 | 846 | 452 |
| 15 | A | Example 11 | (C) | A221 | 1.09 | 950° C., 30 min | 49 | 40 | 751 |
| 16 | A | Example 11 | (B) | A221 | 1.47 | 950° C., 30 min | 42 | 521 | 634 |
| 17 | A | Example 11 | (A) | A221 | 2.19 | 950° C., 30 min | 41 | 120 | 568 |
| 18 | A | Example 15 | (C) | A221 | 1.2 | 950° C., 30 min | 127 | 1003 | 823 |
| 19 | A | Example 15 | (B) | A221 | 1.61 | 950° C., 30 min | 85 | 729 | 776 |
| 20 | A | Example 15 | (A) | A221 | 2.43 | 950° C., 30 min | 66 | 643 | 631 |
| 21 | A | Example 17 | (C) | A221 | 1.24 | 950° C., 30 min | 55 | 112 | 814 |
| 22 | A | Example 17 | (B) | A221 | 1.65 | 950° C., 30 min | 46 | 176 | 793 |
| 23 | A | Example 17 | (A) | A221 | 2.51 | 950° C., 30 min | 40 | 67 | 721 |
| 24 | A | Example 20 | (B) | A251 | 1.2 | 950° C., 30 min | 42 | 134 | 564 |
| 25 | A | Example 21 | (B) | A211 | 1.23 | 950° C., 30 min | 45 | 167 | 424 |
| 26 | A | Example 22 | (B) | A222 | 1.31 | 950° C., 30 min | 43 | 80 | 543 |
| 27 | A | Example 23 | (B) | A232 | 1.16 | 950° C., 30 min | 46 | 145 | 455 |
| 28 | A | Example 24 | (B) | A182 | 1.11 | 950° C., 30 min | 42 | 134 | 623 |
| 29 | A | Example 25 | (B) | A262 | 1.32 | 950° C., 30 min | 45 | 92 | 743 |
| 30 | A | Example 26 | (B) | A266 | 1.21 | 950° C., 30 min | 44 | 102 | 712 |

TABLE 2

| No. | Silicon wafer | Doped slurry, mask material | Spin coating conditions | Polysiloxane | Film thickness (μm) | Diffusion conditions | Diffusivity Surface resistance (Ω/□) | Barrier property Surface resistance (Ω/□) | Diffusion in a gas Surface resistance (Ω/□) |
|---|---|---|---|---|---|---|---|---|---|
| (1) | B | Comparison Example 1 | (C) | — | 0.43 | 950° C., 30 min | 49 | 6 | 43 |
| (2) | B | Example 1 | (C) | A021 | 0.98 | 950° C., 30 min | 41 | 389 | 458 |
| (3) | B | Example 1 | (B) | A021 | 1.40 | 950° C., 30 min | 35 | 513 | 419 |
| (4) | B | Example 3 | (C) | A156 | 1.01 | 950° C., 30 min | 33 | 407 | 488 |
| (5) | B | Example 3 | (B) | A156 | 1.43 | 950° C., 30 min | 34 | 599 | 425 |
| (6) | B | Example 5 | (C) | A156 | 0.95 | 950° C., 30 min | 42 | 506 | 601 |
| (7) | B | Example 5 | (B) | A156 | 1.32 | 950° C., 30 min | 44 | 694 | 543 |
| (8) | B | Example 8 | (C) | A126 | 1.02 | 950° C., 30 min | 42 | 1067 | 922 |
| (9) | B | Example 8 | (B) | A126 | 1.45 | 950° C., 30 min | 46 | 726 | 782 |
| (10) | B | Example 9 | (C) | A021 | 1.03 | 950° C., 30 min | 44 | 421 | 483 |
| (11) | B | Example 9 | (B) | A021 | 1.47 | 950° C., 30 min | 42 | 579 | 443 |
| (12) | B | Example 10 | (C) | A41 | 1.09 | 950° C., 30 min | 36 | 126 | 501 |
| (13) | B | Example 10 | (B) | A41 | 1.47 | 950° C., 30 min | 30 | 227 | 476 |
| (14) | B | Example 10 | (A) | A41 | 2.19 | 950° C., 30 min | 28 | 846 | 423 |
| (15) | B | Example 15 | (C) | A41 | 1.09 | 950° C., 30 min | 49 | 40 | 792 |
| (16) | B | Example 15 | (B) | A4I | 1.47 | 950° C., 30 min | 42 | 521 | 734 |
| (17) | B | Example 15 | (A) | A41 | 2.19 | 950° C., 30 min | 41 | 120 | 653 |
| (18) | B | Example 17 | (C) | A41 | 1.2 | 950° C., 30 min | 127 | 1003 | 802 |

TABLE 2-continued

| No. | Silicon wafer | Doped slurry, mask material | Spin coating conditions | Polysiloxane | Film thickness (μm) | Diffusion conditions | Diffusivity Surface resistance (Ω/□) | Barrier property Surface resistance (Ω/□) | Diffusion in a gas Surface resistance (Ω/□) |
|---|---|---|---|---|---|---|---|---|---|
| (19) | B | Example 17 | (B) | A41 | 1.6 | 950° C., 30 min | 85 | 729 | 764 |
| (20) | B | Example 17 | (A) | A41 | 2.43 | 950° C., 30 min | 66 | 643 | 684 |

As can be found from the evaluation results in Tables 1 and 2, compared with the performance in the Comparison Example 1, both the barrier property and inhibition of diffusion in a gas were greatly improved by adding the doped slurry and mask material provided by the present invention on the basis of keeping equivalent degree of diffusivity.

The actual use includes, but is not limited to: the polymer structure, molecular weight, doped slurry component, doped slurry content, applicable semiconductor substrate, coating condition, diffusion condition, and the like, according to the examples.

Example 27

First, a p-type impurity diffusion composition was coated on whole surface of one side of an n-type semiconductor substrate which is textured on both sides by a spin coater, and dried at 150° C. for 1 min to prepare a semiconductor substrate with a p-type impurity diffusion composition film formed on one side.

Then, as shown in FIG. 3(ii), a semiconductor substrate with a p-type impurity diffusion composition film formed on one side was provided in a diffusion boat. A distance between respective sides on which the p-type impurity diffusion composition films of the semiconductor substrates with two pieces in each group were formed was 3 mm, and a distance between the sides on which the p-type impurity diffusion composition films were not formed was 3 mm.

Then, the diffusion boat was introduced into a diffusion furnace (Koyo Thermo Systems Co., Ltd, 206A-M100), into which $O_2$: 0.2 L/min, and $N_2$: 9.8 L/min flowed, in a state set to 700° C. Then, the semiconductor substrates were heated to 950° C. at a rate of 15° C./min, and thermally processed at 950° C. for 30 min to form a p-type impurity diffusion layer.

Then, the semiconductor substrates were cooled to 830° C. at a rate of 10° C./min. At 830° C., $O_2$: 0.2 L/min, $N_2$: 9.8 L/min, and $N_2$: 1.5 L/min after bubbling in $POCl_3$ flowed into the diffusion furnace, and the p-type impurity diffusion layer was processed for 5 min. Then, the nitrogen flow bubbling in the $POCl_3$ was stopped, the p-type impurity diffusion layer was thermally processed in an inflow gas of $O_2$: 0.2 L/min and $N_2$: 9.8 L/min at the same temperature for 12 min, and an n-type impurity diffusion layer was formed at a position in a field outside the p-type impurity diffusion composition film. Then, the n-type semiconductor substrates were cooled to 700° C. at a rate of 10° C./min, and taken out from the diffusion furnace.

Then, a residual glass layer (the thermal processing product 10 of the p-type impurity diffusion composition and the phosphosilicate glass layer 11) on the surface of the n-type semiconductor substrate was removed using hydrofluoric acid. An average surface resistance in the field of the p-type impurity diffusion layer was 65Ω/□, and an average surface resistance of an area of the n-type impurity diffusion layer formed on a side opposite to the side on which the p-type impurity diffusion composition film was formed was 55 Ω/□.

(Evaluation on Outward Diffusion when Forming the p-Type Impurity Diffusion Layer)

In the n-type impurity diffusion layer of the semiconductor substrate prepared in the Example 27, boron concentration on a surface layer of the n-type semiconductor substrate was determined by SIMS (secondary ion mass spectrum analyzer, Cameca, IMS-7F). $Cs^+$ was used as a primary ion. The boron concentration on the surface layer of the n-type semiconductor substrate was $7*10^{17}$ atom/cm$^3$ or less, thereby inhibiting boron pollution to the surface layer of the n-type semiconductor substrate.

Example 28

A p-type impurity diffusion composition identical to that in the Example 18 was coated on whole surface of one side of an n-type semiconductor substrate which is textured on both sides by spin coating, and dried at 150° C. for 1 min to prepare a semiconductor substrate with a p-type impurity diffusion composition film formed on one side.

Then, as shown in FIG. 3, a semiconductor substrate with a p-type impurity diffusion composition film formed on one side was provided in a diffusion boat. A distance between respective sides on which the p-type impurity diffusion composition films of the semiconductor substrates with two pieces in each group were formed was 0 mm, and a distance between sides on which the p-type impurity diffusion composition films were not formed was 3 mm.

Then, the diffusion boat was introduced into a diffusion furnace (Koyo Thermo Systems Co., Ltd, 206A-M100), into which $O_2$: 0.2 L/min, and $N_2$: 9.8 L/min flowed, in a state set to 700° C. Then, the semiconductor substrates were heated to 950° C. at a rate of 15° C./min, and thermally processed at 950° C. for 30 min to form a p-type impurity diffusion layer.

Then, the semiconductor substrates were cooled to 830° C. at a rate of 10° C./min. At 830° C., $O_2$: 0.2 L/min, $N_2$: 9.8 L/min, and $N_2$: 1.5 L/min after bubbling in $POCl_3$ flowed into the diffusion furnace, and the p-type impurity diffusion layer was processed for 5 min. Then, the nitrogen flow bubbling in the $POCl_3$ was stopped, the p-type impurity diffusion layer was thermally processed in an inflow gas of $O_2$: 0.2 L/min and $N_2$: 9.8 L/min at the same temperature for 12 min, and an n-type impurity diffusion layer was formed at a position in an area outside the p-type impurity diffusion composition film. Then, the n-type semiconductor substrates were cooled to 700° C. at a rate of 10° C./min, and taken out from the diffusion furnace.

Then, a residual glass layer (the thermal processing product 10 of the p-type impurity diffusion composition and the phosphosilicate glass layer 11) on the surface of the n-type semiconductor substrate was removed using hydrofluoric acid. An average surface resistance in an area of the p-type impurity diffusion layer was 67Ω/□, and an average surface resistance in the area of the n-type impurity diffusion layer formed on a side opposite to the side on which the p-type impurity diffusion composition film was formed was 56 Ω/□.

(Evaluation on Outward Diffusion when Forming the p-Type Impurity Diffusion Layer)

In the n-type impurity diffusion layer of the semiconductor substrate prepared in the Example 28, boron concentration on the surface layer of the n-type semiconductor substrate was determined by SIMS (secondary ion mass spectrum analyzer, Cameca, IMS-7F). $Cs^+$ was used as a primary ion. The boron concentration on the surface layer of the n-type semiconductor substrate was $6*10^{16}$ atom/cm$^3$ or less, thereby inhibiting boron pollution to the surface layer of the n-type semiconductor substrate.

Example 29

A p-type impurity diffusion composition identical to that in the Example 18 was coated on whole surface of one side of an n-type semiconductor substrate which is textured on both sides by spin coating, and dried at 150° C. for 1 min to prepare a semiconductor substrate with a p-type impurity diffusion composition film formed on one side.

Then, as shown in FIG. 3, a semiconductor substrate with a p-type impurity diffusion composition film formed on one side was provided in a diffusion boat. A distance between respective sides on which the p-type impurity diffusion composition films of the semiconductor substrates with two pieces in each group were formed was 0 mm, and a distance between sides on which the p-type impurity diffusion composition films were not formed was 3 mm.

Then, the diffusion boat was introduced into a diffusion furnace (Koyo Thermo Systems Co., Ltd, 206A-M100), into which $O_2$: 0.2 L/min, and $N_2$: 9.8 L/min flowed, in a state set to 700° C. Then, the semiconductor substrates were heated to 950° C. at a rate of 15° C./min, and thermally processed at 950° C. for 30 min to form a p-type impurity diffusion layer.

Then, the semiconductor substrates were cooled to 830° C. at a rate of 10° C./min. At 830° C., $O_2$: 0.2 L/min, $N_2$: 9.8 L/min, and $N_2$: 1.5 L/min after bubbling in $POCL_3$ flowed into the diffusion furnace, and the p-type impurity diffusion layer was processed for 5 min. Then, the nitrogen flow bubbling in the $POCl_3$ was stopped, the p-type impurity diffusion layer was thermally processed in an inflow gas of $O_2$: 0.2 L/min and $N_2$: 9.8 L/min at the same temperature for 12 min, and an n-type impurity diffusion layer was formed at a position in an area outside the p-type impurity diffusion composition film. Then, the n-type semiconductor substrates were cooled to 700° C. at a rate of 10° C./min, and taken out from the diffusion furnace.

Then, the semiconductor substrates were heated to 900° C. at a rate of 10° C./min, and thermally processed in a gas flow of $O_2$: 5 L/min at the same temperature (900° C.) for 20 min to oxidize the surfaces of the semiconductor substrates.

Then, the n-type semiconductor substrates were cooled to 700° C. at a rate of 10° C./min, and taken out from the diffusion furnace.

Then, a residual glass layer (the thermal processing product 10 of the p-type impurity diffusion composition and the phosphosilicate glass layer 11) on the surface of the n-type semiconductor substrate was removed using hydrofluoric acid. An average surface resistance in the area of the p-type impurity diffusion layer was 60Ω/□, and an average surface resistance in the area of the n-type impurity diffusion layer formed on a side opposite to the side on which the p-type impurity diffusion composition film was formed was 51 Ω/□.

(Evaluation on Outward Diffusion when Forming the p-Type Impurity Diffusion Layer)

In the n-type impurity diffusion layer of the semiconductor substrate prepared in the Example 29, boron concentration on the surface layer of the n-type semiconductor substrate was determined by SIMS (secondary ion mass spectrum analyzer, Cameca, IMS-7F). $Cs^+$ was used as a primary ion. The boron concentration on the surface layer of the n-type semiconductor substrate was $5*10^{15}$ atom/cm$^3$ or less, thereby inhibiting boron pollution to the surface layer of the n-type semiconductor substrate.

Example 30

A p-type impurity diffusion composition identical to that in the Example 18 was coated on whole surface of one side of an n-type semiconductor substrate which is textured on both sides by spin coating, and dried at 150° C. for 1 min to prepare a semiconductor substrate with a p-type impurity diffusion composition film formed on one side.

Then, as shown in FIG. 3, a semiconductor substrate with a p-type impurity diffusion composition film formed on one side was provided in a diffusion boat. A distance between respective sides on which the p-type impurity diffusion composition films of the semiconductor substrates with two pieces in each group were formed was 0 mm, and a distance between sides on which the p-type impurity diffusion composition films were not formed was 3 mm.

Then, the diffusion boat was introduced into a diffusion furnace (Koyo Thermo Systems Co., Ltd, 206A-M100), into which $O_2$: 0.2 L/min, and $N_2$: 9.8 L/min flowed, in a state set to 700° C. Then, the semiconductor substrates were heated to 950° C. at a rate of 15° C./min, and thermally processed at 950° C. for 30 min to form a p-type impurity diffusion layer.

Then, the semiconductor substrates were cooled to 900° C. at a rate of 10° C./min. Then, the semiconductor substrates were thermally processed in a gas flow of $O_2$: 5 L/min at the same temperature (900° C.) for 20 min to oxidize the surfaces of the semiconductor substrates.

Then, the semiconductor substrates were cooled to 830° C. at a rate of 10° C./min. At 830° C., $O_2$: 0.2 L/min, $N_2$: 9.8 L/min, and $N_2$: 1.5 L/min after bubbling in $POCL_3$ flowed into the diffusion furnace, and the p-type impurity diffusion layer was processed for 5 min. Then, the nitrogen flow bubbling in the $POCl_3$ was stopped, the p-type impurity diffusion layer was thermally processed in an inflow gas of $O_2$: 0.2 L/min and $N_2$: 9.8 L/min at the same temperature for 12 min, and an n-type impurity diffusion layer was formed at a position in an area outside the p-type impurity diffusion composition film. Then, the n-type semiconductor substrates were cooled to 700° C. at a rate of 10° C./min, and taken out from the diffusion furnace.

Then, a residual glass layer (the thermal processing product 10 of the p-type impurity diffusion composition and the phosphosilicate glass layer 11) on the surface of the n-type semiconductor substrate was removed using hydrofluoric acid. An average surface resistance in the area of the p-type impurity diffusion layer was 62Ω/□, and an average surface resistance in the area of the n-type impurity diffusion layer formed on a side opposite to the side on which the p-type impurity diffusion composition film was formed was 61 Ω/□.

(Evaluation on Outward Diffusion when Forming the p-Type Impurity Diffusion Layer)

In the n-type impurity diffusion layer of the semiconductor substrate prepared in the Example 30, boron concentration on the surface layer of the n-type semiconductor substrate was determined by SIMS (secondary ion mass spectrum analyzer, Cameca, IMS-7F). Cs$^+$ was used as a primary ion. The boron concentration on the surface layer of the n-type semiconductor substrate was $2*10^{16}$ atom/cm$^3$ or less, thereby inhibiting boron pollution to the surface layer of the n-type semiconductor substrate.

Example 31

A p-type impurity diffusion composition identical to that in the Example 18 was coated on whole surface of one side of an n-type semiconductor substrate which is textured on both sides by spin coating, and dried at 150° C. for 1 min to prepare a semiconductor substrate with a p-type impurity diffusion composition film formed on one side.

Then, as shown in FIG. 3, a semiconductor substrate with a p-type impurity diffusion composition film formed on one side was provided in a diffusion boat. A distance between respective sides on which the p-type impurity diffusion composition films of the semiconductor substrates with two pieces in each group were formed was 0 mm, and a distance between sides on which the p-type impurity diffusion composition films were not formed was 3 mm.

Then, the diffusion boat was introduced into a diffusion furnace (Koyo Thermo Systems Co., Ltd, 206A-M100), into which O$_2$: 0.2 L/min, and N$_2$: 9.8 L/min flowed in a state set to 700° C.

Then, the semiconductor substrates were heated to 900° C. at a rate of 15° C./min, and thermally processed in a gas flow of O$_2$: 5 L/min at the same temperature (900° C.) for 20 min to oxidize the surfaces of the semiconductor substrates.

Then, the semiconductor substrates were heated to 950° C. at a rate of 15° C./min, and thermally processed at 950° C. for 30 min to form a p-type impurity diffusion layer.

Then, the semiconductor substrates were cooled to 830° C. at a rate of 10° C./min. At 830° C., O$_2$: 0.2 L/min, N$_2$: 9.8 L/min, and N$_2$: 1.5 L/min after bubbling in POCL$_3$ flowed into the diffusion furnace, and the p-type impurity diffusion layer was processed for 5 min. Then, the nitrogen flow bubbling in the POCl$_3$ was stopped, the p-type impurity diffusion layer was thermally processed in an inflow gas of O$_2$: 0.2 L/min and N$_2$: 9.8 L/min at the same temperature for 12 min, and an n-type impurity diffusion layer was formed at a position in an area outside the p-type impurity diffusion composition film. Then, the n-type semiconductor substrates were cooled to 700° C. at a rate of 10° C./min, and taken out from the diffusion furnace.

Then, a residual glass layer (the thermal processing product 10 of the p-type impurity diffusion composition and the phosphosilicate glass layer 11) on the surface of the n-type semiconductor substrate was removed using hydrofluoric acid. An average surface resistance in the area of the p-type impurity diffusion layer was 64Ω/□, and an average surface resistance in the area of the n-type impurity diffusion layer formed on a side opposite to the side on which the p-type impurity diffusion composition film was formed was 65 Ω/□.

(Evaluation on Outward Diffusion when Forming the p-Type Impurity Diffusion Layer)

In the n-type impurity diffusion layer of the semiconductor substrate prepared in the Example 31, boron concentration on the surface layer of the n-type semiconductor substrate was determined by SIMS (secondary ion mass spectrum analyzer, Cameca Company, IMS-7F). Cs$^+$ was used as a primary ion. The boron concentration on the surface layer of the n-type semiconductor substrate was $4*10^{16}$ atom/cm$^3$ or less, thereby inhibiting boron pollution to the surface layer of the n-type semiconductor substrate.

Comparison Example 4

A p-type impurity diffusion composition identical to that in the Example 18 was coated on whole surface of one side of an n-type semiconductor substrate which is textured on both sides by spin coating, and dried at 150° C. for 1 min to prepare a semiconductor substrate with a p-type impurity diffusion composition film formed on one side.

Figure 6:
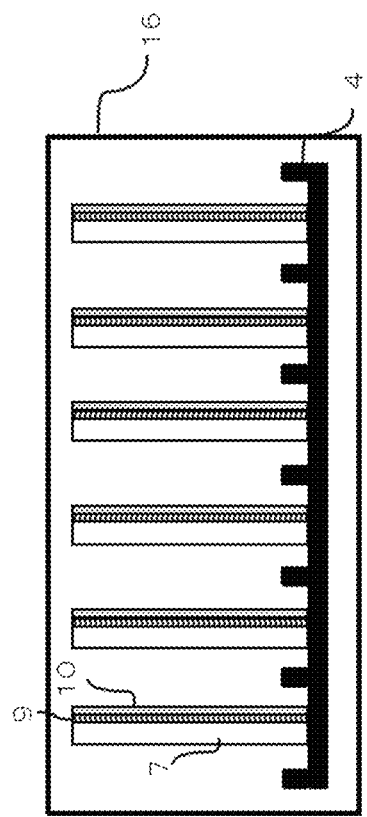
FIG. 6 is a schematic sectional view of a semiconductor substrate on a diffusion boat in a comparison example.

Then, as shown in FIG. 6, respective sides on which the p-type impurity diffusion composition film was formed were faced towards one direction, and a semiconductor substrate with the p-type impurity diffusion composition film formed on one side was provided in a diffusion boat. Distances between the semiconductor substrates were all 3 mm.

Then, the diffusion boat was introduced into a diffusion furnace (Koyo Thermo Systems Co., Ltd, 206A-M100), into which O$_2$: 0.2 L/min, and N$_2$: 9.8 L/min flowed, in a state set to 700° C. Then, the semiconductor substrates were heated to 950° C. at a rate of 15° C./min, and thermally processed at 950° C. for 30 min to form a p-type impurity diffusion layer.

Then, the semiconductor substrates were cooled to 830° C. at a rate of 10° C./min. At 830° C., O$_2$: 0.2 L/min, N$_2$: 9.8 L/min, and N$_2$: 1.5 L/min after bubbling in POCL$_3$ flowed into the diffusion furnace, and the p-type impurity diffusion layer was processed for 5 min. Then, the nitrogen flow bubbling in the POCl$_3$ was stopped, the p-type impurity diffusion layer was thermally processed in an inflow gas of O$_2$: 0.2 L/min and N$_2$: 9.8 L/min at the same temperature for 12 min, and an n-type impurity diffusion layer was formed at a position in an area outside the p-type impurity diffusion composition film. Then, the n-type semiconductor substrates were cooled to 700° C. at a rate of 10° C./min, and taken out from the diffusion furnace.

Then, a residual glass layer (the thermal processing product 10 of the p-type impurity diffusion composition and the phosphosilicate glass layer 11) on the surface of the n-type semiconductor substrate was removed using hydrofluoric acid. An average surface resistance in the area of the p-type impurity diffusion layer was 66Ω/□, and an average surface resistance in the area of the n-type impurity diffusion layer formed on a side opposite to the side on which the p-type impurity diffusion composition film was formed was 56 Ω/□.

(Evaluation on Outward Diffusion when Forming the p-Type Impurity Diffusion Layer)

In the n-type impurity diffusion layer of the semiconductor substrate prepared in the Comparison Example 4, boron concentration on the surface layer of the n-type semiconductor substrate was determined by SIMS (secondary ion mass spectrum analyzer, Cameca, IMS-7F). Cs$^+$ was used as a primary ion. The boron concentration on the surface layer of the n-type semiconductor substrate was $1*10^{20}$ atom/cm$^3$ or less, thereby inhibiting boron pollution to the surface layer of the n-type semiconductor substrate.

As can be found from the evaluation results, compared with the performance in the Comparison Example 4, the method for manufacturing a semiconductor unit according to the present invention can very effectively inhibit outward diffusion of boron, and specifically greatly reduces pollution to the surface of the n-type substrate.

<<Industrial Availability>>

The polysiloxane provided by the present invention can be used in a doped slurry, a mask material, or a semiconductor (including a solar cell).

What is claimed is:

1. A polysiloxane, comprising at least one segment selected from a molecular structure shown by formula 1,

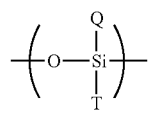

Formula 1 wherein in formula 1,

Q is a structural segment shown by formula 2,

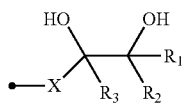

Formula 2 wherein in formula 2,

X is an alkyl having less than 7 carbon atoms, or an alkyl having less than 7 non-hydrogen atoms in the main chain and containing a heteroatom; and $R_1$, $R_2$, and $R_3$ are each independently a hydrogen atom, or a substituent having less than 3 carbon atoms, or the $R_2$ binds to a carbon atom on the X to form a cyclic substituent; and in formula 1, T is a hydroxyl, an alkyl, an alkyl containing an alcoholic hydroxyl and having less than 12 carbon atoms in the main chain, or an alkyl containing an alcoholic hydroxyl and having less than 12 non-hydrogen atoms in the main chain and containing a heteroatom.

2. The polysiloxane according to claim 1, wherein the X is an alkyl having less than 7 non-hydrogen atoms in the main chain and containing a heteroatom.

3. The polysiloxane according to claim 1, wherein the $R_1$, $R_2$, and $R_3$ are each independently a hydrogen atom, or a substituent having 1 carbon atom, or the $R_2$ binds to a carbon atom on the X to form a cyclic substituent.

4. The polysiloxane according to claim 1, wherein the $R_1$, $R_2$, and $R_3$ are each independently a hydrogen atom.

5. The polysiloxane according to claim 1, wherein the polysiloxane only comprises the molecular structure segment shown by formula 1 and the Q is formed by a molecular structure segment shown by formula 2.

6. The polysiloxane according to claim 5, wherein the molecular structure segments have identical molecular structure segments.

7. The polysiloxane according to claim 1, further comprising at least one segmenent selected from a molecular structure shown by formula 3 at a molar content of 1 to 99%,

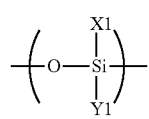

Formula 3 wherein in formula 3, X1 is an alkyl having less than 8 carbon atoms, or an aryl having less than 10 carbon atoms; and Y1 is a hydroxyl, an aryl having less than 10 carbon atoms, or an alkyl having less than 8 carbon atoms.

8. The polysiloxane according to claim 7, wherein a molar content of the molecular structure segment shown by formula 3 is 1 to 50%.

9. The polysiloxane according to claim 7, wherein the Y1 is a hydroxyl.

10. The polysiloxane according to claim 1, wherein the T is a hydroxyl, an alkyl having less than 8 carbon atoms, or a structure shown by formula 4,

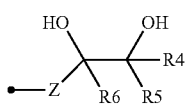

Formula 4 wherein in formula 4,

Z is an alkyl having less than 7 carbon atoms, or an alkyl having less than 7 non-hydrogen atoms in the main chain and containing a heteroatom; and R4, R5, and R6 are each independently a hydrogen atom, or a substituent having less than 3 carbon atoms, or the R5 binds to a carbon atom on the Z to form a cyclic substituent.

11. The polysiloxane according to claim 10, wherein the Z is an alkyl having less than 7 non-hydrogen atoms in the main chain and containing a heteroatom.

12. The polysiloxane according to claim 1, wherein the T is a hydroxyl.

13. A material for solar energy and a semiconductor, comprising:

the polysiloxane according to claim 1,
a dopant component A,
a polymer binder B, and
a solvent C.

14. The material for solar energy and a semiconductor according to claim 13, wherein the dopant component A is an n-type dopant component of a compound containing an element of a 5th main group, or a p-type dopant component of a compound containing an element of a 3rd main group.

15. The material for solar energy and a semiconductor according to claim 14, wherein the dopant component A contains an inorganic boron compound component, or an inorganic phosphorus compound component.

16. The material for solar energy and a semiconductor according to claim 13, wherein a molecular structure repeating unit of the polymer binder B contains an alcoholic hydroxyl.

17. The material for solar energy and a semiconductor according to claim 16, wherein the polymer binder B has a weight average molecular weight in a range of 1,000 to 300,000.

18. The material for solar energy and a semiconductor according to claim 13, wherein the solvent C comprises 0 to 50% water and 50 to 100% organic solvent.

19. The material for solar energy and a semiconductor according to claim 18, wherein the solvent C is an organic solvent having a boiling point of 50 to 300° C.

20. The material for solar energy and a semiconductor according to claim 18, wherein a total addition amount of the dopant component A, the polymer binder B, the polysiloxane, and the solvent C is 2 to 30% relative to a total mass of a slurry.

21. A method for manufacturing a semiconductor unit of a semiconductor substrate, comprising following steps a to c,
    a. coating the material according to claim 18 on one side of each semiconductor substrate as a first conductive type impurity diffusion composition, to form a first conductive type impurity diffusion composition film,
    b. heating the semiconductor substrate on which the first conductive type impurity diffusion composition film obtained in the step a is formed, to enable the first conductive type impurity contained in the dopant component A of the material to diffuse into the semiconductor substrate, to form a first conductive type impurity diffusion layer, and
    c. heating the semiconductor substrate in an atmosphere of a gas containing a second conductive type impurity, to enable the second conductive type impurity to diffuse into the semiconductor substrate, to form a second conductive type impurity diffusion layer,
    wherein in the step b and the step c, respective sides on which the first conductive type impurity diffusion composition films of the semiconductor substrates with two pieces in each group are formed are oppositely placed.

22. The method for manufacturing a semiconductor unit according to claim 21, wherein the step c is carried out using a thermal processing product of the first conductive type impurity diffusion composition film as a mask after the step b.

23. The method for manufacturing a semiconductor unit according to claim 21, wherein the step c is carried out after the step b and in succession to the step b.

24. The method for manufacturing a semiconductor unit according to claim 21, wherein in the step c, a heating temperature when forming the second conductive type impurity diffusion layer is 50 to 200° C. lower than a temperature when forming the first conductive type impurity diffusion layer in the step b.

25. The method for manufacturing a semiconductor unit according to claim 21, further comprising a step d: oxidizing surface of the semiconductor substrate in an oxygen-containing atmosphere.

26. The method for manufacturing a semiconductor unit according to claim 25, wherein the step d is carried out after the step c and in succession to the step c.

27. The method for manufacturing a semiconductor unit according to claim 21, wherein in the step b and the step c, for a plurality of groups of the semiconductor substrates with two pieces in each group, a distance between sides on which the first conductive type impurity diffusion composition films in each group are formed is W1, a distance between sides opposite to the sides on which the first conductive type impurity diffusion composition films in adjacent two groups are formed is W2, and W1 and W2 satisfy W1<W2.

28. The method for manufacturing a semiconductor unit according to claim 27, wherein in configurations of a plurality of pieces of the semiconductor substrates in the step b and the step c, the distance between sides on which the first conductive type impurity diffusion composition films of the semiconductor substrates with two pieces in each group are formed is 0 mm.

29. The method for manufacturing a semiconductor unit according to claim 21, wherein the step b is carried out in an oxygen-containing atmosphere.

30. The method for manufacturing a semiconductor unit according to claim 29, wherein a ratio of nitrogen to oxygen in the atmosphere in the step b is identical to a ratio of nitrogen to oxygen in an atmosphere in the step c.

31. The method for manufacturing a semiconductor unit according to claim 21, wherein the first conductive type is a p-type, and the second conductive type is an n-type.

32. A solar cell prepared by the method for manufacturing a semiconductor unit according to claim 21.

\* \* \* \* \*